(12) United States Patent
Nagatomo et al.

(10) Patent No.: US 11,569,253 B2
(45) Date of Patent: Jan. 31, 2023

(54) SEMICONDUCTOR MEMORY DEVICE

(71) Applicant: Kioxia Corporation, Minato-ku (JP)

(72) Inventors: Takeshi Nagatomo, Yokkaichi (JP); Tatsuo Izumi, Yokkaichi (JP); Ryota Suzuki, Yokkaichi (JP); Takuya Nishikawa, Yokkaichi (JP); Yasuhito Nakajima, Yokkaichi (JP); Daiki Takayama, Yokkaichi (JP); Hiroaki Naito, Yokkaichi (JP); Genki Kawaguchi, Yokkaichi (JP)

(73) Assignee: Kioxia Corporation, Minato-ku (JP)

( * ) Notice: Subject to any disclaimer, the term of this patent is extended or adjusted under 35 U.S.C. 154(b) by 204 days.

(21) Appl. No.: 17/008,975

(22) Filed: Sep. 1, 2020

(65) Prior Publication Data

US 2020/0395371 A1 Dec. 17, 2020

Related U.S. Application Data

(63) Continuation of application No. PCT/JP2019/009686, filed on Mar. 11, 2019.

(30) Foreign Application Priority Data

Mar. 20, 2018 (JP) .............................. JP2018-052558

(51) Int. Cl.
*H01L 27/11582* (2017.01)
*H01L 27/11556* (2017.01)
(Continued)

(52) U.S. Cl.
CPC .. *H01L 27/11556* (2013.01); *H01L 27/11582* (2013.01); *H01L 27/11519* (2013.01); *H01L 27/11565* (2013.01)

(58) Field of Classification Search
CPC ................................................ H01L 27/11582
See application file for complete search history.

(56) References Cited

U.S. PATENT DOCUMENTS 9,768,192 B1 9/2017 Nakamura
2009/0146206 A1 6/2009 Fukuzumi et al.
(Continued)

FOREIGN PATENT DOCUMENTS

JP 2009-135324 A 6/2009
JP 2013-197419 A 9/2013

OTHER PUBLICATIONS

International Search Report dated Jun. 4, 2019 in PCT/JP2019/009686 filed on Mar. 11, 2019, citing documents AB-AE & AP therein, 1 page.

*Primary Examiner* — Christopher A Johnson
(74) *Attorney, Agent, or Firm* — Oblon, McClelland, Maier & Neustadt, L.L.P.

(57) ABSTRACT

A semiconductor memory device includes multiple first electrode layers stacked in a first direction, multiple second electrode layers stacked in the first direction, a first columnar body extending through the multiple first electrode layers in the first direction, a second columnar body extending through the multiple second electrode layers in the first direction, a connection part connecting the first columnar body and the second columnar body, and a spacer film having an island configuration surrounding the connection part. The multiple first electrode layers and the multiple second electrode layers are arranged in the first direction, and the connection part and the spacer film are provided between the multiple first electrode layers and the multiple second electrode layers.

13 Claims, 28 Drawing Sheets

(51) Int. Cl.
    *H01L 27/11519*    (2017.01)
    *H01L 27/11565*    (2017.01)

(56) References Cited

U.S. PATENT DOCUMENTS

| | | | |
|---|---|---|---|
| 2016/0300848 A1* | 10/2016 | Pachamuthu | H01L 27/11582 |
| 2017/0236835 A1* | 8/2017 | Nakamura | H01L 29/42372 |
| | | | 257/314 |
| 2017/0271261 A1* | 9/2017 | Tsutsumi | H01L 27/11565 |
| 2017/0271352 A1 | 9/2017 | Nakamura | |
| 2018/0006049 A1 | 1/2018 | Inomata et al. | |

* cited by examiner

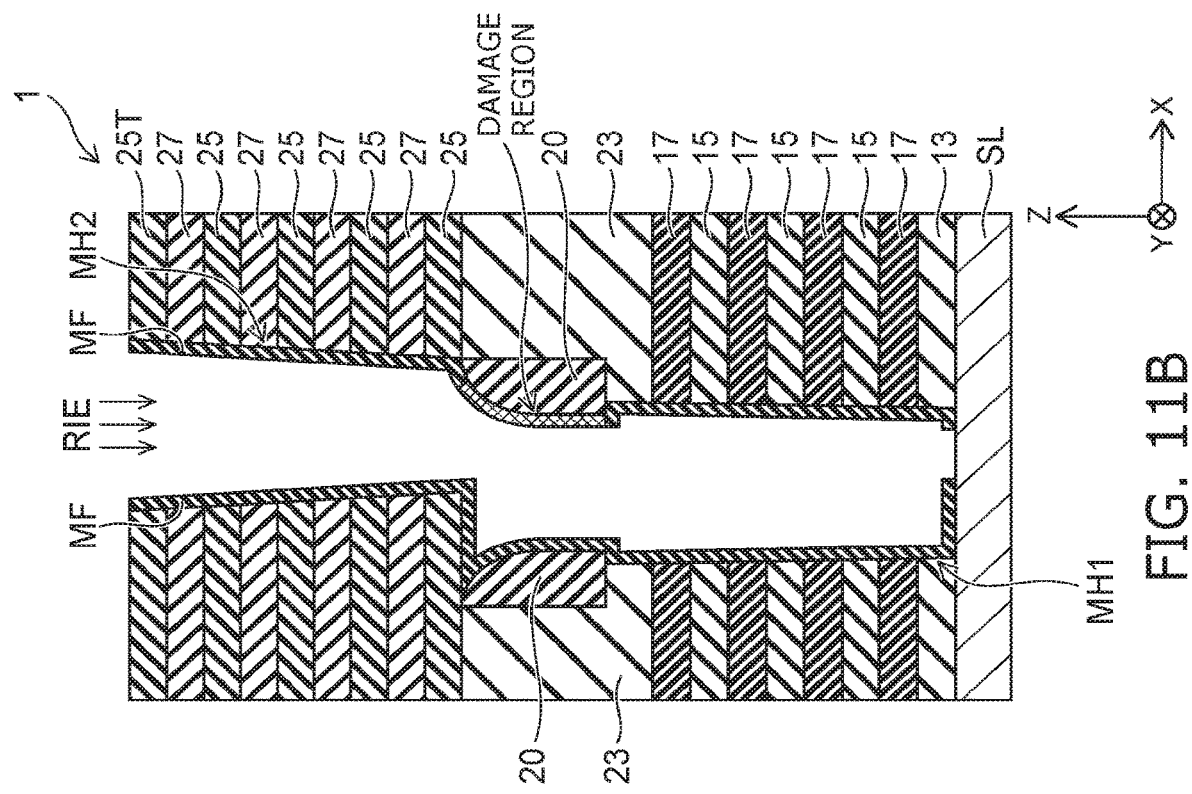
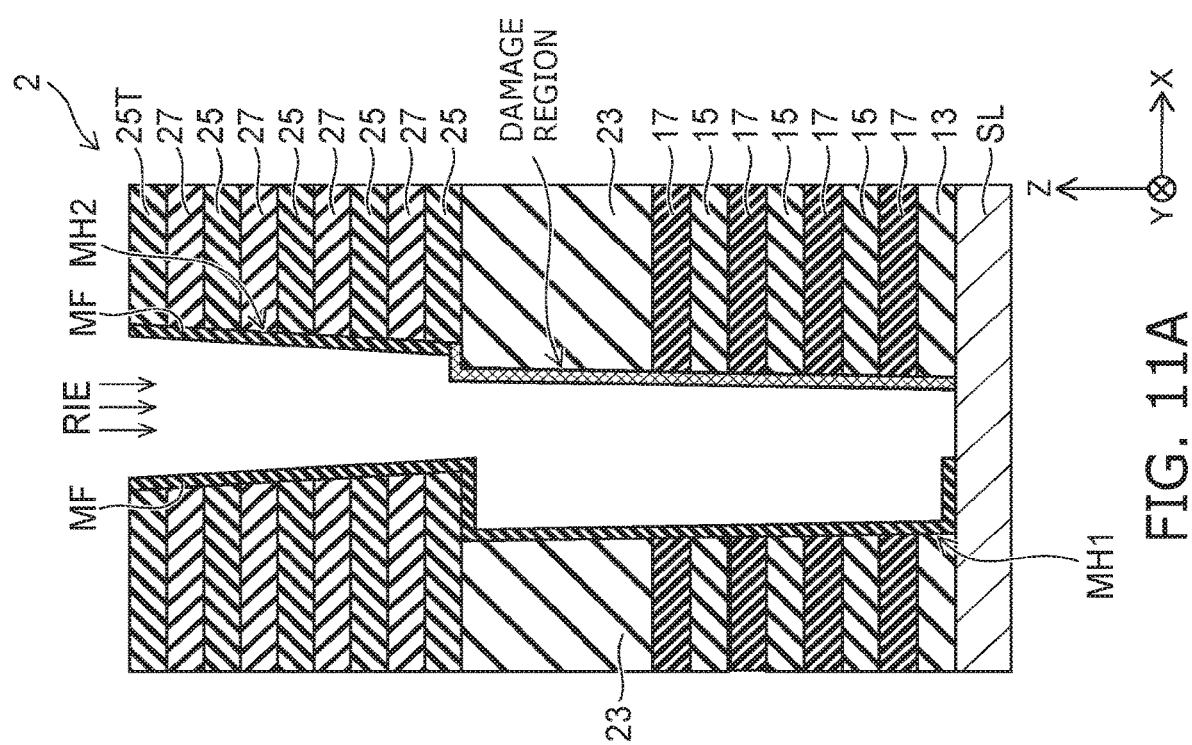

SEMICONDUCTOR MEMORY DEVICE

CROSS-REFERENCE TO RELATED APPLICATIONS

This is a continuation application of International Application PCT/JP2019/009686, filed on Mar. 11, 2019. This application also claims priority to Japanese Application No. 2018-052558, filed on Mar. 20, 2018. The entire contents of each are incorporated herein by reference.

FIELD

Embodiments relate to a semiconductor memory device.

BACKGROUND

Semiconductor memory devices in which memory cells are three-dimensionally arranged are being developed. For example, a NAND nonvolatile memory device includes the multiple electrode layers stacked on a conductive layer, and a semiconductor film and a charge storage film provided in a memory hole extending through the multiple electrode layers; and memory cells are provided at the portions where the memory hole extends through the electrode layers. The memory capacity of such a memory device can be increased by increasing the layer number of electrode layers. However, as the layer number of the electrode layers increases, it becomes difficult to form the memory hole that extends through the multiple electrode layers.

In contrast, a method can be used in which a first memory hole is formed to extend through multiple first electrode layers, and then, a second memory is formed to extend through multiple second electrode layers stacked on the first electrode layers so that the second memory hole communicates with the first memory hole. Although the difficulty is reduced thereby in the etching for forming a memory hole extending through the electrode layers stacked with the large layer number, there may be cases where a charge storage film formed in the first memory hole is subjected to the process damage due to the misalignment of the second memory hole.

BRIEF DESCRIPTION OF THE DRAWINGS

FIGS. 11A and 11B are schematic cross-sectional views showing a characteristic of the memory device according to the first embodiment;

DETAILED DESCRIPTION

Figure 1:
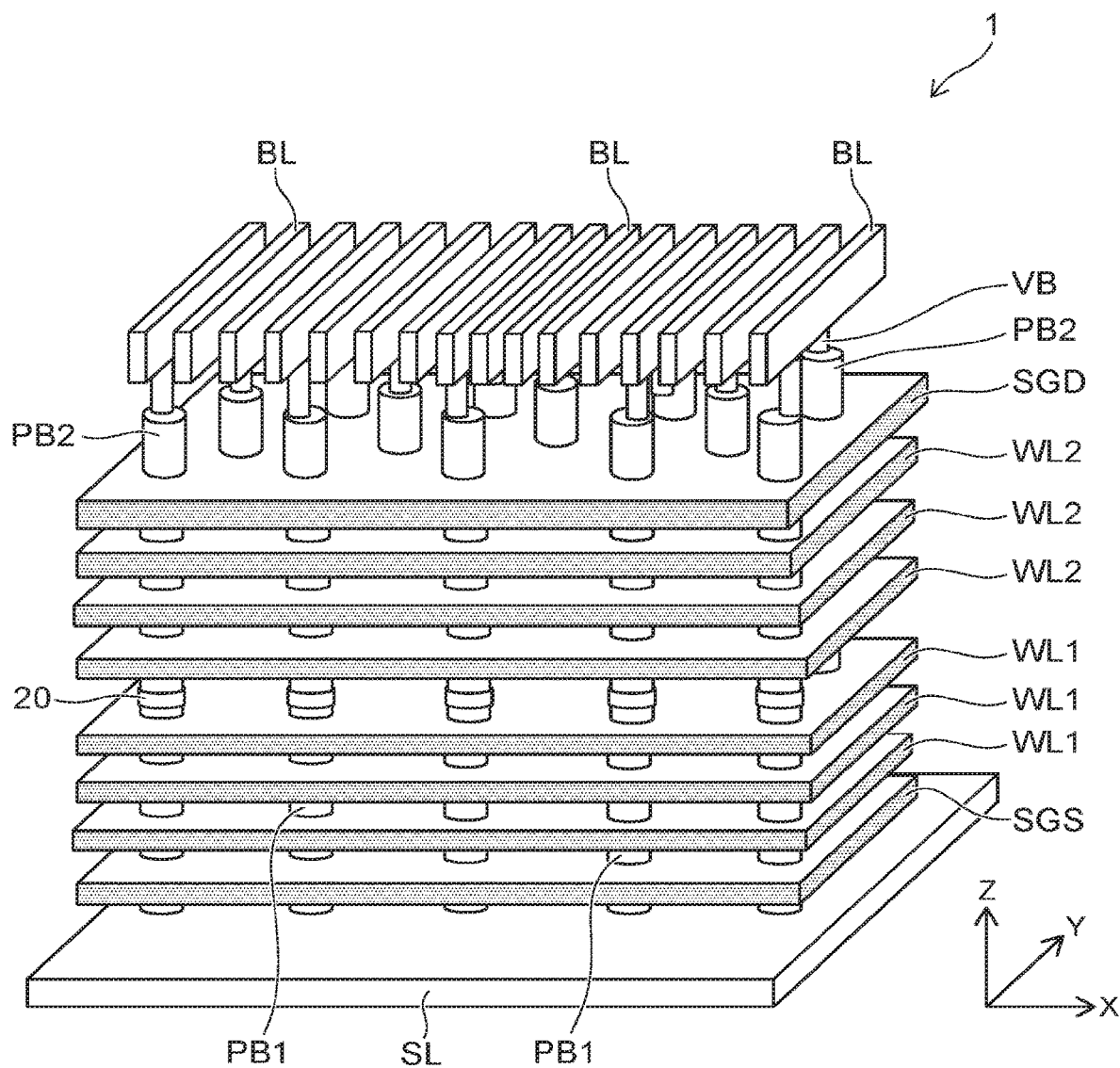
FIG. 1 is a perspective view schematically showing a memory device 1 according to a first embodiment.

According to one embodiment, a semiconductor memory device includes multiple first electrode layers stacked in a first direction, multiple second electrode layers stacked in the first direction, a first columnar body extending through the multiple first electrode layers in the first direction, a second columnar body extending through the multiple second electrode layers in the first direction, a connection part connecting the first columnar body and the second columnar body, and a spacer film having an island configuration surrounding the connection part. The multiple first electrode layers and the multiple second electrode layers are arranged in the first direction, and the connection part and the spacer film are provided between the multiple first electrode layers and the multiple second electrode layers.

Embodiments will now be described with reference to the drawings. The same portions inside the drawings are marked with the same numerals; a detailed description is omitted as appropriate; and the different portions are described. The drawings are schematic and conceptual; and the relationships between the thicknesses and widths of portions, the proportions of sizes among portions, etc., are not necessarily the same as the actual values. Also, the dimensions and/or the ratios may be illustrated differently between the drawings, even in the case where the same portion is illustrated.

Also, the dispositions and the configurations of the portions are described using an X-axis, a Y-axis, and a Z-axis shown in the drawings. The X-axis, the Y-axis, and the Z-axis are orthogonal to each other and respectively refer to an X-direction, a Y-direction, and a Z-direction. Also, there are cases where the Z-direction is described as upward, and the reverse direction thereof is described as downward.

First Embodiment

FIG. 1 is a perspective view schematically showing a memory device 1 according to a first embodiment. The memory device 1 is, for example, a NAND flash memory device that includes three-dimensionally arranged memory cells. The insulating films are not illustrated in FIG. 1 to show the structure of the memory device 1.

As shown in FIG. 1, the memory device 1 includes multiple first electrode layers (hereinbelow, a select gate SGS and a word line WL1), multiple second electrode layers (hereinbelow, a word line WL2 and a select gate SGD), a columnar body PB1, and a columnar body PB2.

For example, the select gate SGS, the word lines WL1, the word lines WL2, and the select gate SGD are stacked on a source layer SL. The source layer SL is, for example, a P-type well provided in a silicon substrate (not illustrated). Also, the source layer SL may be a metal layer or a polysilicon layer provided on a silicon substrate with an inter-layer insulating film (not illustrated) interposed.

The first columnar body PB1 extends in the stacking direction (the Z-direction) through the select gate SGS and the word line WL1. The second columnar body PB2 extends in the Z-direction through the word line WL2 and the select gate SGD.

The memory device 1 further includes a spacer film 20 and a bit line BL. The spacer film 20 is provided in an island configuration to surround a connection part JP between the columnar body PB1 and the columnar body PB2 (referring to FIG. 2). In other words, the spacer film 20 is provided between the first columnar body PB1 and the second columnar body PB2, and is provided apart from another spacer film 20 that is provided between another first columnar body PB1 and another second columnar body PB2. For example, the spacer films 20 that are adjacent to each other in the X-direction and the Y-direction are provided apart from each other. The bit line BL is electrically connected to a semiconductor film SF included in the columnar body PB2 (referring to FIG. 2) via a connection plug VB.

Figure 2:
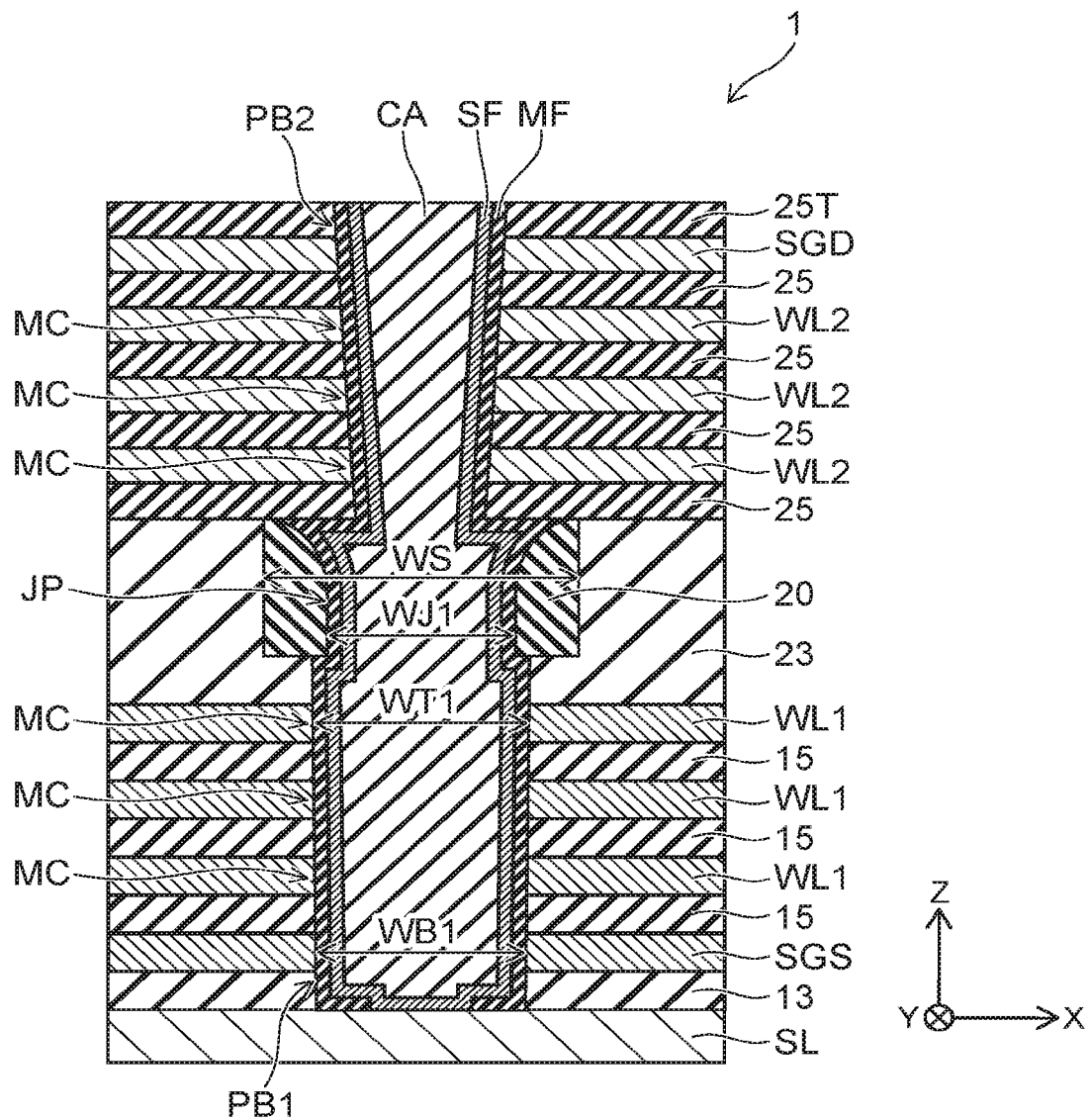
FIG. 2 is a schematic cross-sectional view showing the memory device according to the first embodiment.

FIG. 2 is a schematic cross-sectional view showing the memory device 1 according to the first embodiment. The cross-sectional structure of the columnar bodies PB1 and PB2 and the connection part JP is shown in FIG. 2.

As shown in FIG. 2, the memory device 1 includes a memory film MF, the semiconductor film SF, and an insulating core CA. The memory film MF, the semiconductor film SF, and the insulating core CA extend in the Z-direction through the select gate SGS, the word lines WL1, the word lines WL2, and the select gate SGD. For example, when the memory film MF, the semiconductor film SF, and the insulating core CA are regarded as a continuous body, the columnar body PB1 is a portion lower than the connection part JP, and the columnar body PB2 is a portion higher than the connection part JP.

The insulating core CA is, for example, silicon oxide extending in the Z-direction. The semiconductor film SF is, for example, a polysilicon film provided to cover the insulating core CA. The semiconductor film SF contacts the source layer SL and is electrically connected to the source layer SL at the bottom of the columnar body PB1.

The memory film MF is provided to cover the side surface of the semiconductor film SF. The memory film MF is an insulating film that has a charge storage function. For example, memory cells MC are provided at the portions where the columnar body PB1 crosses the word lines WL1 and the portions where the columnar body PB2 crosses the word lines WL2. The memory film MF is provided between the semiconductor film SF and the word lines WL1 and between the semiconductor film SF and the word lines WL2. The memory film MF includes portions serving respectively as charge storage portions of the memory cells MC. Alternatively, the memory film MF may have a floating gate structure in which an insulating film surrounds a conductive film.

The memory device 1 includes inter-layer insulating films 13, 15, 23, and 25. The inter-layer insulating film 13 is provided between the source layer SL and the select gate SGS. The inter-layer insulating films 15 are provided between the word lines WL1 adjacent to each other in the Z-direction. The inter-layer insulating film 23 is provided between the word line WL1 and the word line WL2 and surrounds the spacer film 20. The inter-layer insulating films 25 are provided between the word lines WL2 adjacent to each other in the Z-direction.

As shown in FIG. 2, the spacer film 20 is provided to surround the connection part JP between the columnar body PB1 and the columnar body PB2. For example, a width WS1 in the X-direction of the spacer film 20 is greater than a width WT1 of the first columnar body PB1 at a portion thereof extending through the word line WL1. Also, a minimum width WJ1 in the X-direction of the connection part JP is less than the width WT1 of the columnar body PB1 at the portion extending through the word line WL1. Here, the width WT1 of the columnar body PB1 is the width of the columnar body PB1 at the portion thereof extending through the word line WL1 that is most proximate to the connection part JP among the multiple word lines WL1.

Also, the minimum width WJ1 of the connection part JP is less than a width WB1 of the columnar body PB1. The width WB1 of the columnar body PB1 is, for example, the width of a portion extending through the select gate SGS or the word line WL1 most proximate to the lower end of the columnar body PB1. In the example, the width WB1 is the width thereof at a portion extending through the select gate SGS.

For example, when the X-Y cross sections of the columnar body PB1 and the connection part JP are substantially circular, the outer diameter WJ1 of the connection part JP is less than the outer diameter WT1 and the outer diameter WB1 of the columnar body PB1.

A method for manufacturing the memory device 1 according to the first embodiment will now be described with reference to FIGS. 3 to 10. FIGS. 3A to 6B, FIG. 7, FIG. 8A, FIG. 8B, FIG. 9, and FIG. 10 are schematic cross-sectional views showing manufacturing processes of the memory device 1.

Figure 3A:
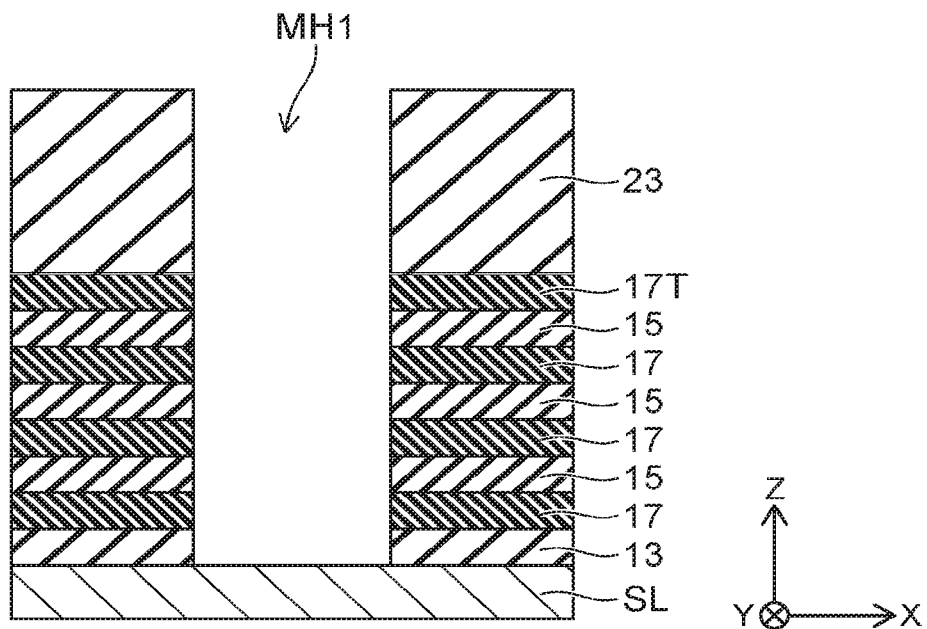
FIGS. 3A to 10 are schematic cross-sectional views showing manufacturing processes of the memory device according to the first embodiment.

As shown in FIG. 3A, the inter-layer insulating films 13, 15, and 23 and a sacrificial film 17 are stacked on the source layer SL. The inter-layer insulating films 15 and the sacrificial film 17 are alternately stacked on the inter-layer insulating film 13. The inter-layer insulating film 23 is formed on the sacrificial film 17T that is provided at the top of the multiple sacrificial films 17. The inter-layer insulating films 13, 15, and 23 are, for example, silicon oxide films. The sacrificial films 17 are, for example, silicon nitride films.

Continuing, a memory hole MH1 is formed with a depth reaching the source layer SL from the upper surface of the inter-layer insulating film 23. For example, the memory hole MH1 is formed by selectively removing the inter-layer insulating films 13, 15, and 23 and the sacrificial films 17 by using RIE (Reactive Ion Etching).

Figure 3B:
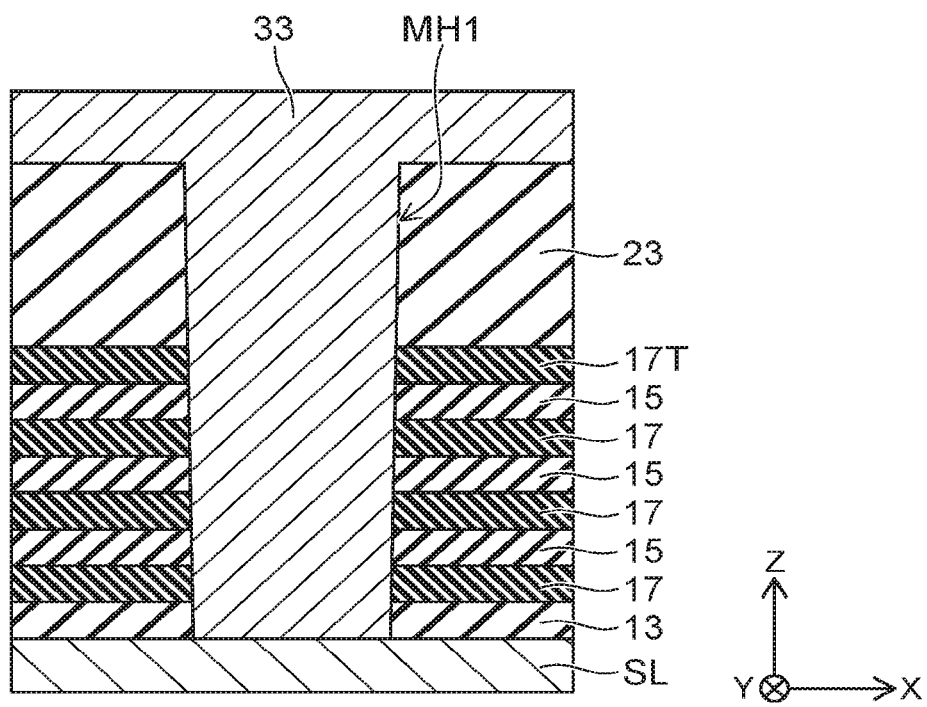

As shown in FIG. 3B, a sacrificial film 33 is formed to fill the memory hole MH1. The sacrificial film 33 is, for example, an amorphous silicon film formed using CVD (Chemical Vapor Deposition).

Figure 4A:
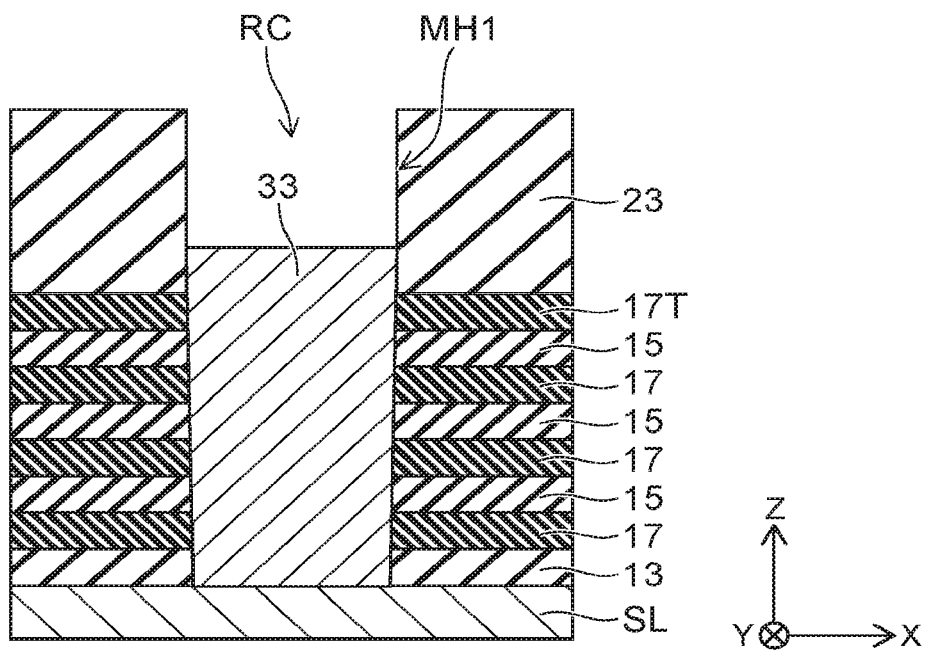

As shown in FIG. 4A, a recess portion RC is formed in the upper portion of the memory hole MH1 by etching back the sacrificial film 33. The recess portion RC is formed so that the bottom surface of the recess portion RC is positioned at a higher level than the sacrificial film 17T. The sacrificial film 17T is provided at the top position of the multiple sacrificial films 17 stacked in the Z-direction.

Figure 4B:
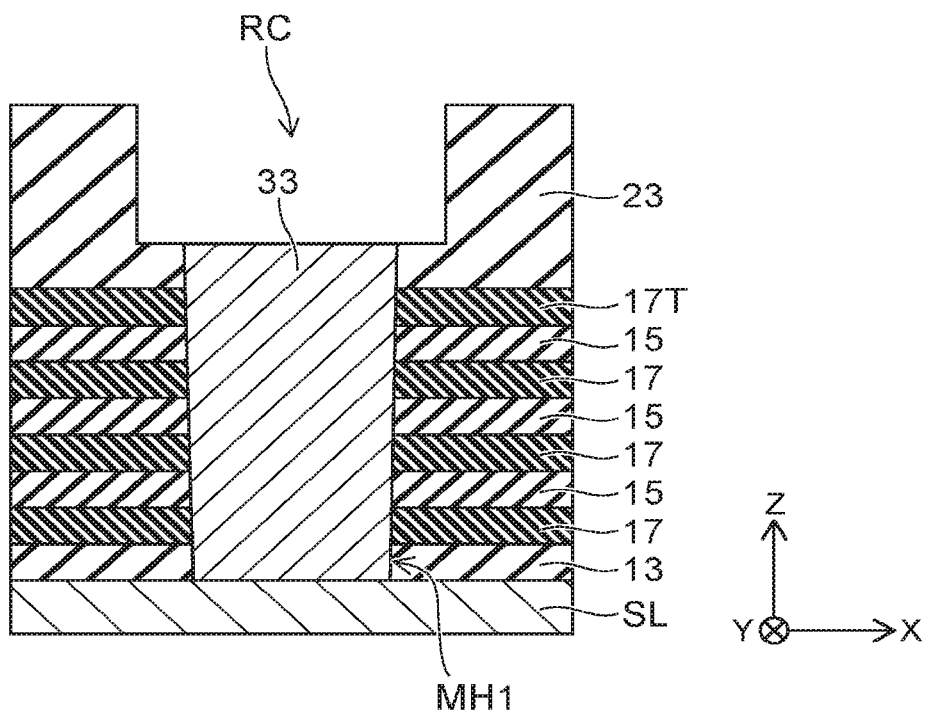

As shown in FIG. 4B, for example, the recess portion RC is enlarged in the lateral direction by the etching of the inter-layer insulating film 23 using isotropic dry etching. That is, the width of the recess portion RC is made greater than the width of the memory hole MH1. For example, when the X-Y cross section of the memory hole MH1 is substantially circular, the center of the recess portion RC matches the center of the memory hole MH1.

Figure 5A:
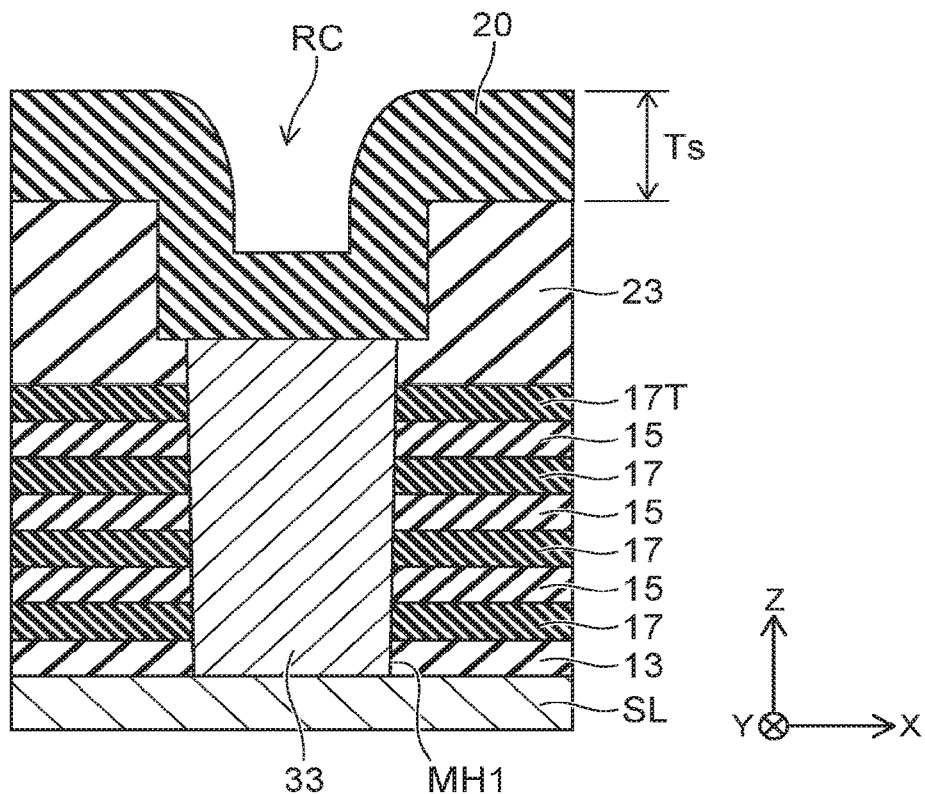

As shown in FIG. 5A, the spacer film 20 is formed to cover the inner surface of the recess portion RC. The spacer film 20 includes a material different from the sacrificial film 33. The spacer film 20 may include, for example, silicon oxide ($SiO_2$), aluminum oxide ($Al_2O_3$), hafnium oxide (HfO) or silicon nitride (SiN). The spacer film 20 may be polysilicon or amorphous silicon to which an impurity is added, or silicon carbide (SiC).

Figure 5B:
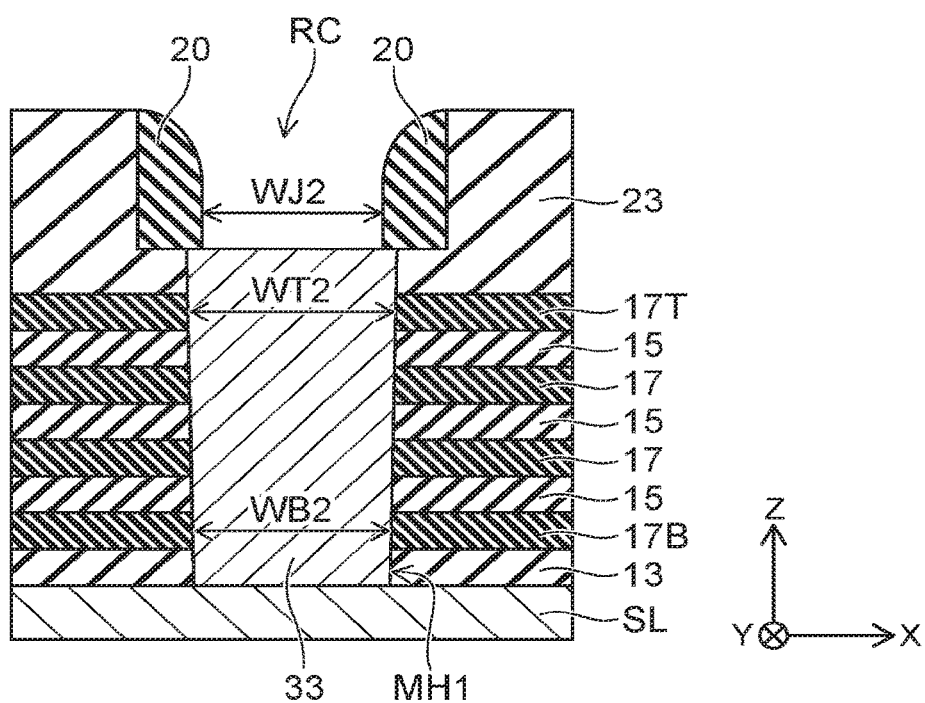

As shown in FIG. 5B, the spacer film 20 is etched back so that a portion thereof contacting the inner wall of the recess portion RC remains. For example, the portions thereof that are deposited on the upper surface of the inter-layer insulating film 23 and on the sacrificial film 33 are removed using anisotropic RIE. Thereby, for example, the spacer film 20 remains, which has a ring configuration along the inner wall of the recess portion RC.

A thickness Ts of the spacer film 20 deposited on the inter-layer insulating film 23 (referring to FIG. 5A) is set so that a space remains inside the recess portion RC and, after the etching of the spacer film 20, a minimum width WJ2 of the recess portion RC is less than a width WT2 and a width WB2 of the memory hole MH1. Here, when the X-Y cross section of the memory hole MH1 is substantially circular, the minimum width WJ2 is the inner diameter of the ring-shaped spacer film 20. Also, the width WT2 of the memory hole MH1 is the inner diameter thereof at the portion extending through the sacrificial film 17T, and the width WB2 is the inner diameter thereof at a portion extending through the sacrificial film 17B that is provided at a position most proximate to the bottom surface of the memory hole MH1.

Figure 6A:
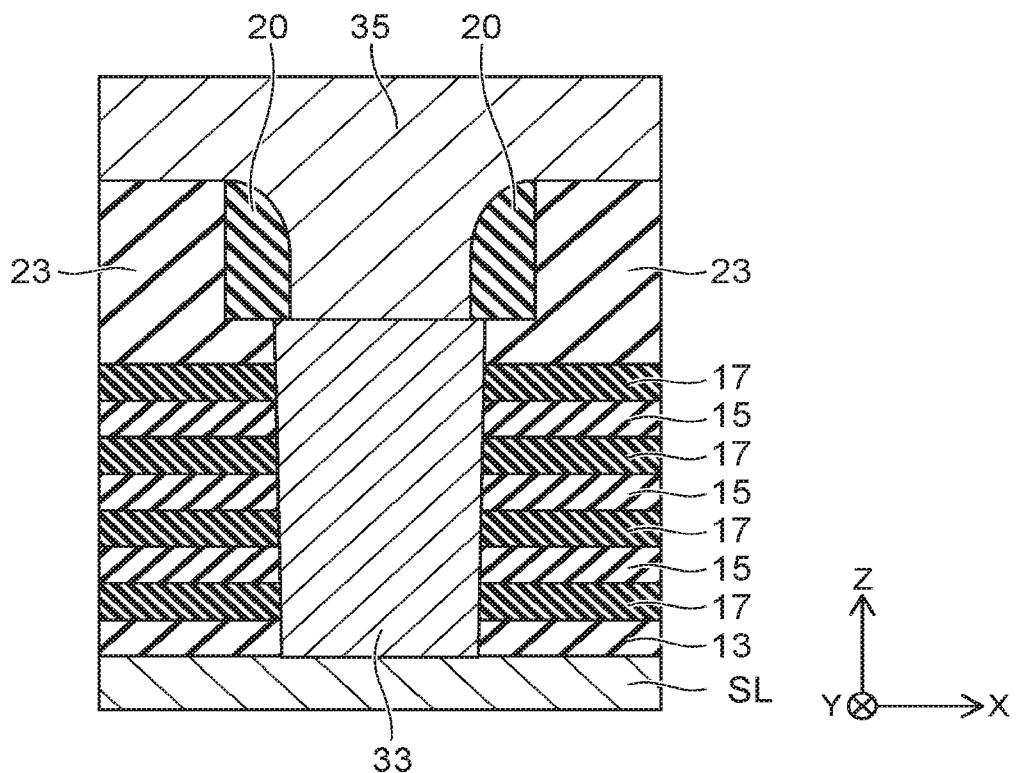

As shown in FIG. 6A, a sacrificial film 35 is formed to fill the recess portion RC. The sacrificial film 35 is, for example, an amorphous silicon film.

Figure 6B:
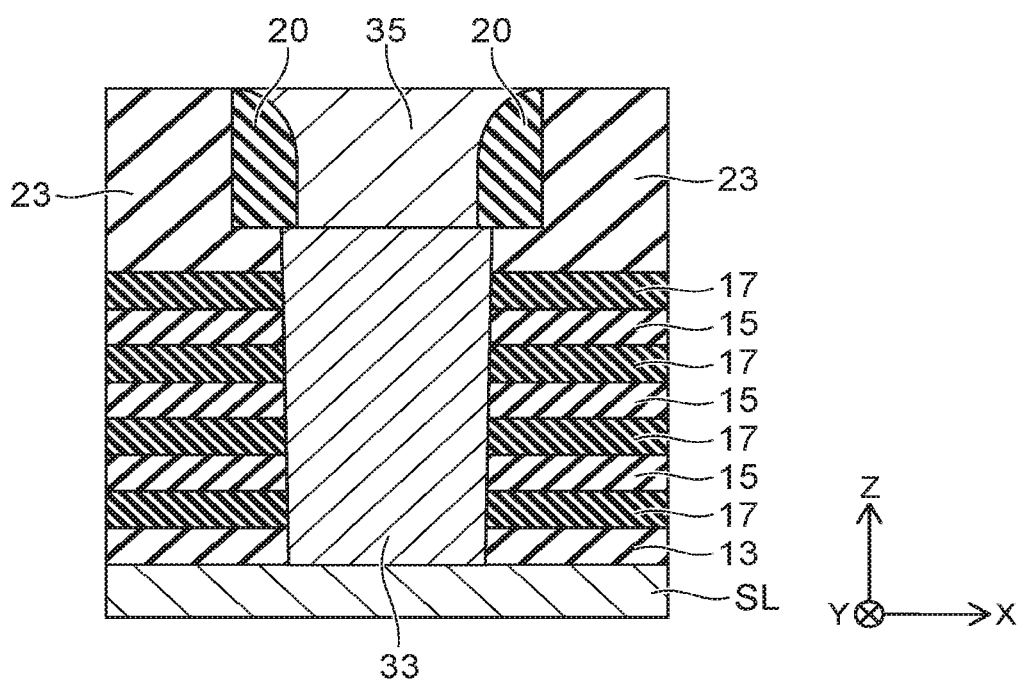

As shown in FIG. 6B, the sacrificial film 35 is polished using, for example, CMP (Chemical Mechanical Polishing) to expose the inter-layer insulating film 23. Thereby, the sacrificial film 35 can be removed so that a portion of the sacrificial film 35 remains which fills the recess portion RC.

Figure 7:
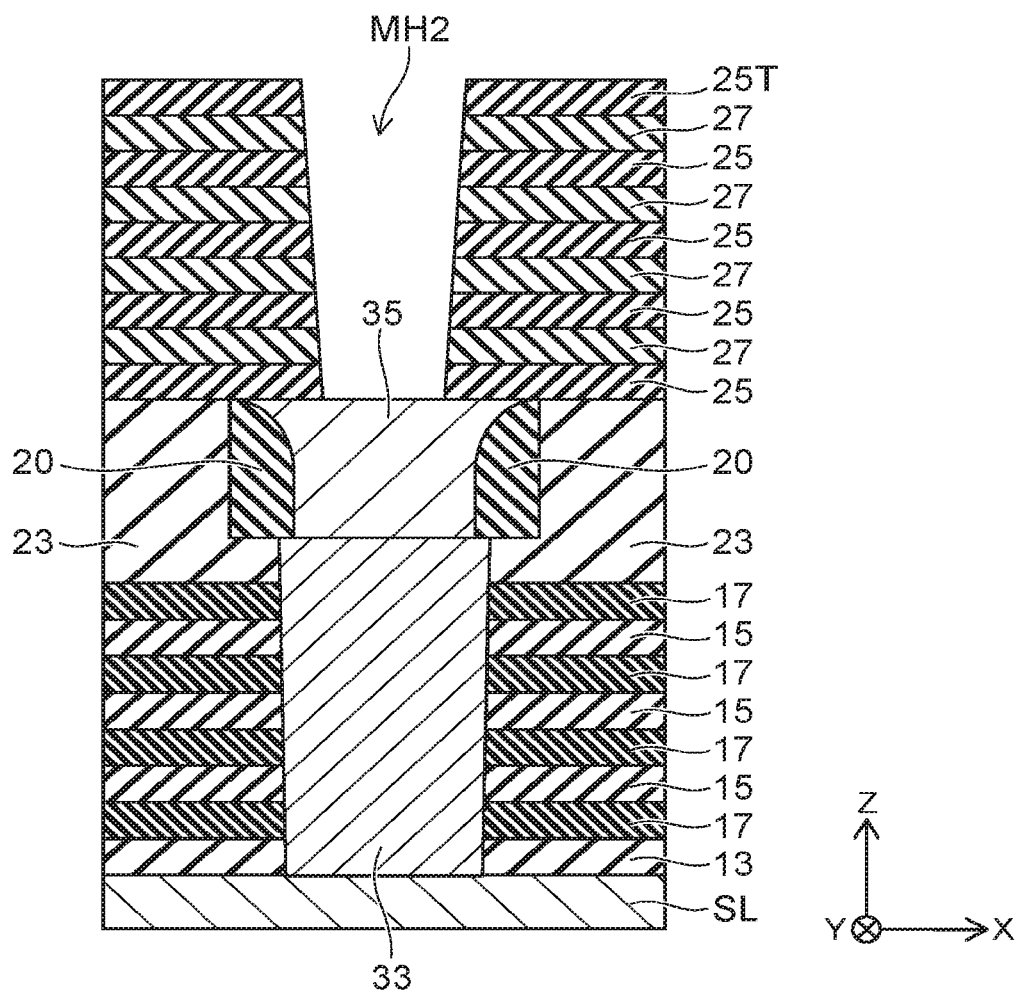

As shown in FIG. 7, the inter-layer insulating films 25 and sacrificial films 27 are stacked alternately on the inter-layer insulating film 23 and the sacrificial film 35. The inter-layer insulating films 25 are, for example, silicon oxide films, and the sacrificial films 27 are, for example, silicon nitride films. Also, a memory hole MH2 that communicates with the sacrificial film 35 is formed from the upper surface of an inter-layer insulating film 25T provided at the top position of the multiple inter-layer insulating films 25.

Figure 8A:
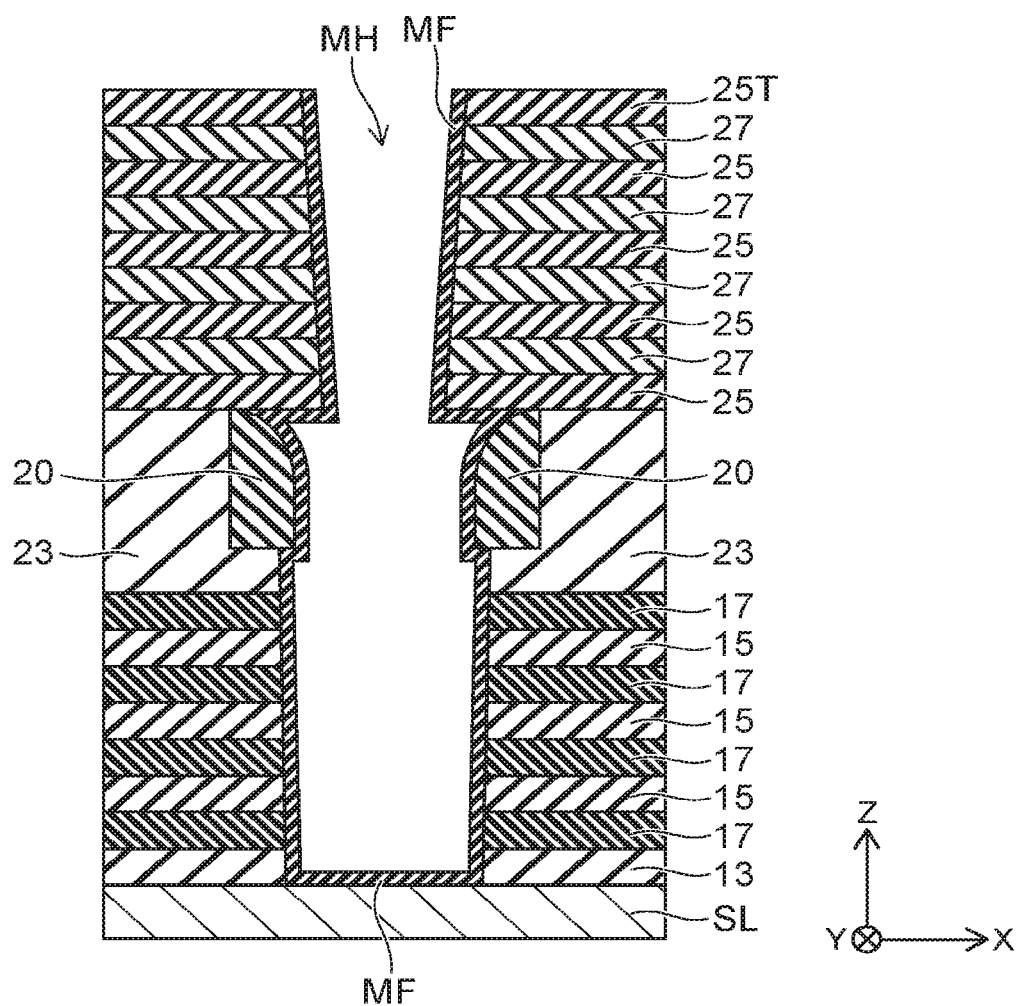

As shown in FIG. 8A, the sacrificial film 35 and the sacrificial film 33 are selectively removed via the memory hole MH2 to form a memory hole MH in which the memory hole MH1 and the memory hole MH2 are joined together. Subsequently, the memory film MF is formed on the inner surface of the memory hole MH.

Thus, when the number of stacks of the word lines WL is large, it is preferable to form the memory hole MH1 and the memory hole MH2 separately so as to finally form one memory hole MH. Thereby, the difficulty can be reduced in the etching process, etc., when forming the memory hole MH extending through the large number of word lines WL.

Figure 8B:
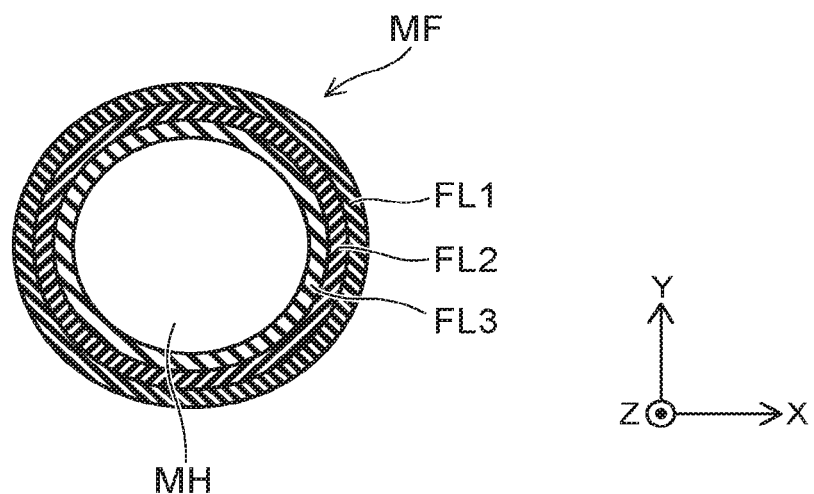

FIG. 8B is a schematic view showing an X-Y cross section of the memory hole MH. As shown in FIG. 8B, the memory film MF has a structure in which a blocking insulating film FL1, a charge storage film FL2, and a tunnel insulating film FL3 are stacked in order on the inner surface of the memory hole MH. The blocking insulating film FL1 and the tunnel insulating film FL3 are, for example, silicon oxide films. The charge storage film FL2 is, for example, a silicon nitride film. The blocking insulating film FL1 may include, for example, a metal oxide.

Figure 9:
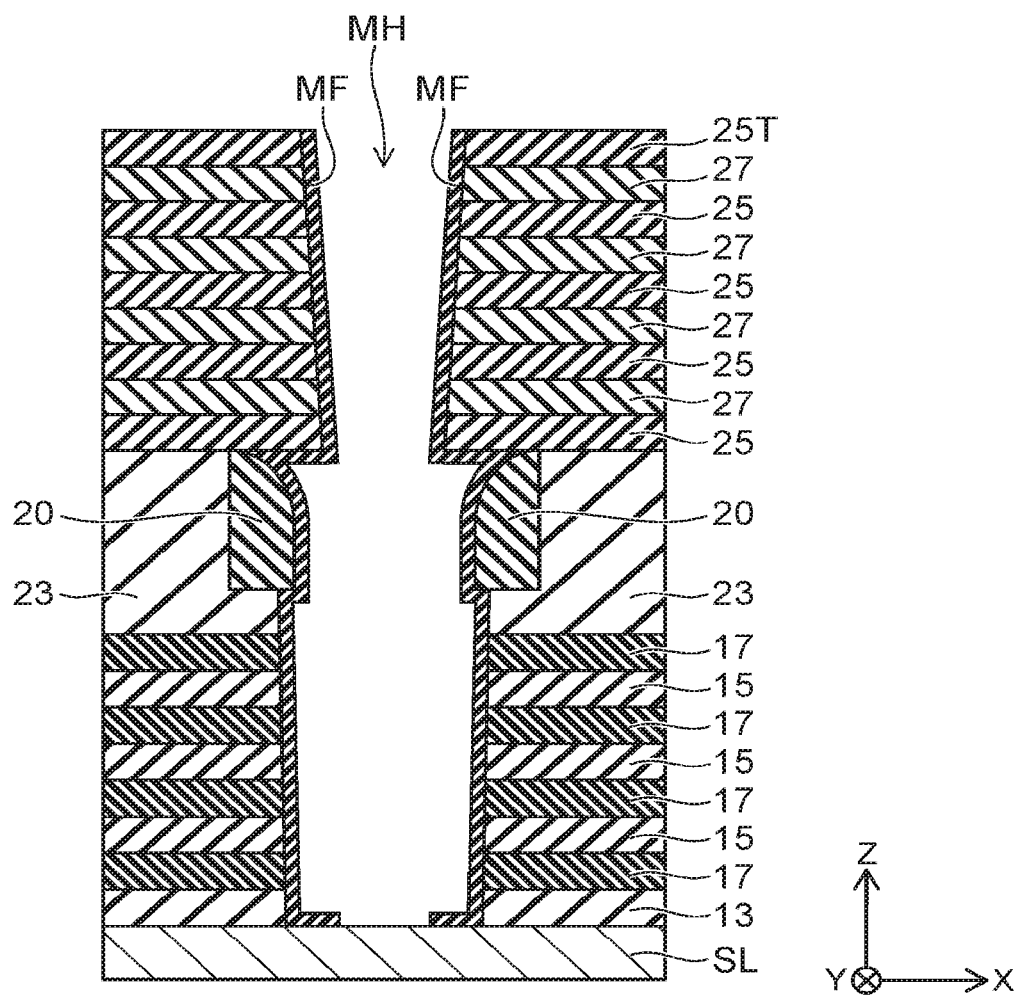

As shown in FIG. 9, a portion of the memory film MF is selectively removed, which is formed on the source layer SL at the bottom surface of the memory hole MH. For example, the memory film MF is selectively removed using anisotropic RIE.

Figure 10:
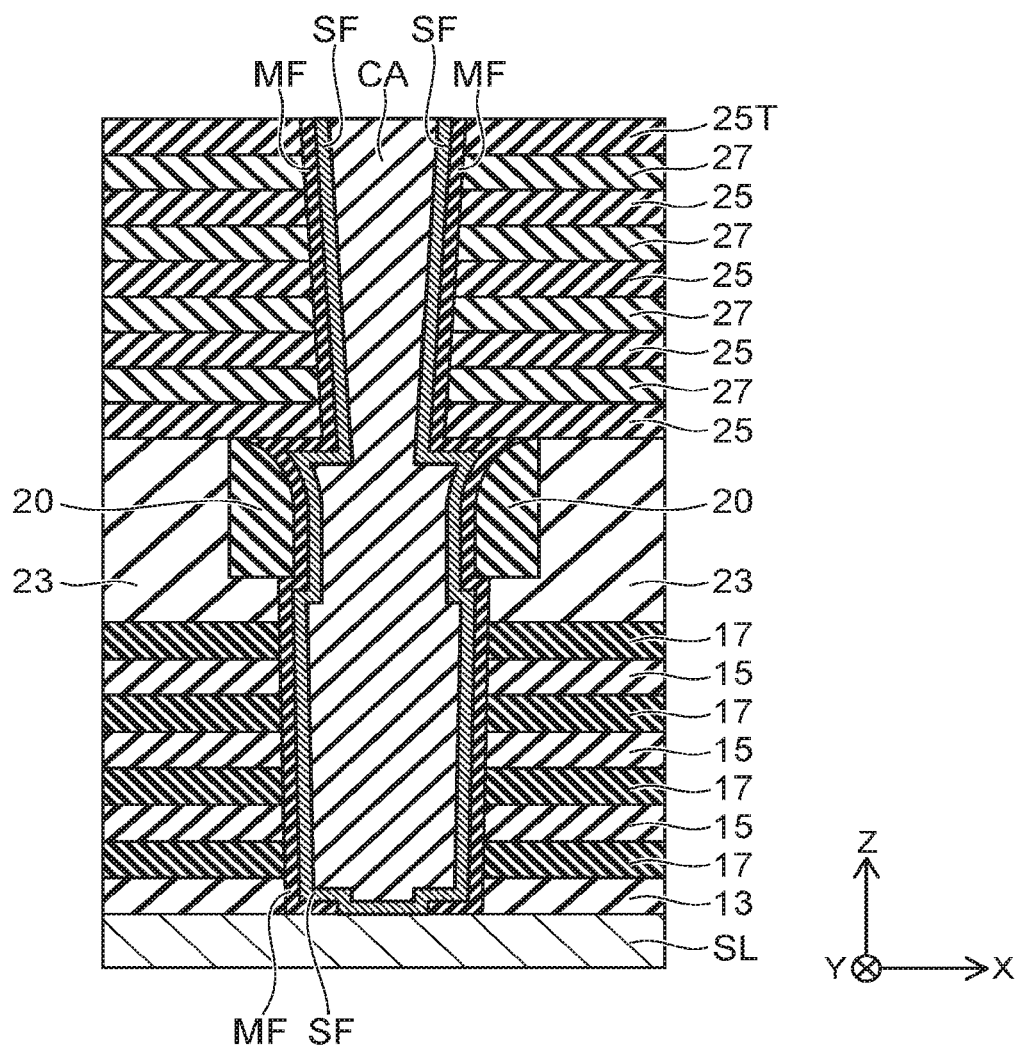

As shown in FIG. 10, the semiconductor film SF is formed to cover the inner surface of the memory hole MH after the memory film MF is formed. The semiconductor film SF is, for example, a polysilicon film. The semiconductor film SF is formed to contact the memory film MF. Also, the semiconductor film SF contacts the source layer SL at the bottom of the memory hole MH.

Moreover, the insulating core CA is formed to fill the interior of the memory hole MH. The insulating core CA is, for example, silicon oxide deposited using CVD. Then, the sacrificial films 17 and 25 are selectively removed, and the word lines WL1 and WL2 and the select gates SGS and SGD are formed by replacing the sacrificial films 17 and 25 with metal layers.

FIGS. 11A and 11B are schematic cross-sectional views showing a characteristic of the memory device 1 according to the first embodiment. FIG. 11A is a schematic cross-sectional view showing the process of selectively removing the memory film MF in a memory device 2 according to a comparative example. FIG. 11B is a schematic cross-sectional view showing the process of selectively removing the memory film MF of the memory device 1.

As shown in FIG. 11A, the spacer film 20 is not included in the memory device 2. Also, as shown in FIG. 11A, the memory hole MH2 is misaligned with respect to the memory hole MH1.

As shown in FIG. 11A, the inner wall of the memory hole MH1 has a portion exposed via the memory hole MH2 due to the misalignment of the memory hole MH2. In such a case, when the portion of the memory film MF that is formed on the source layer SL is removed by RIE at the opening side of the memory hole MH2, a portion of the inner wall is subjected to ion bombardment in the memory hole MH1. Therefore, a damage region is partially formed in the memory film MF that is formed on the inner wall of the memory hole MH1. As a result, there may be some defects in the memory cells MC such as degradation of the charge storage characteristics, an increase of the leakage current, etc.

In contrast, as shown in FIG. 11B, the memory device 1 has a configuration in which the inner wall of the memory hole MH1 is shielded by the spacer film 20 and cannot be viewed from the opening side of the memory hole MH2. Therefore, the memory film that is formed on the inner wall of the memory hole MH1 is protected by the spacer film 20 when removing the portion of the memory film MF on the source layer SL. Although the memory film MF includes a portion formed on the surface of the spacer film 20, which is damaged by the ion bombardment, the portion of the memory film MF provided on the spacer film 20 is electrically isolated and does not affect on the operation of the memory device 1.

Thus, in the memory device 1 according to the embodiment, the memory film MF formed on the inner wall of the memory hole MH1 can be protected, and the degradation of the characteristics of the memory cells MC can be prevented by providing the spacer film 20 at the connection portion between the memory hole MH1 and the memory hole MH2.

Moreover, as shown in FIG. 11B, the width of the opening that links the memory hole MH1 and the memory hole MH2 becomes narrow when the memory hole MH2 is misaligned with respect to the memory hole MH1. Thus, there may be a case where the communication between the memory hole MH1 and the memory hole MH2 is blocked in the process of forming the memory film MF and the semiconductor film SF on the inner surface of the memory hole MH (referring to FIG. 10). Accordingly, it is preferable for the memory hole MH1 that the widths thereof in the X-direction and the Y-direction (e.g., the inner diameter) is greater than the widths in the X-direction and the Y-direction of the memory hole MH2. In other words, it is preferable for the columnar body PB1 that the widths thereof in the X-direction and the Y-direction (e.g., the outer diameter) is greater than the widths in the X-direction and the Y-direction of the columnar body PB2.

Second Embodiment

Figure 12:
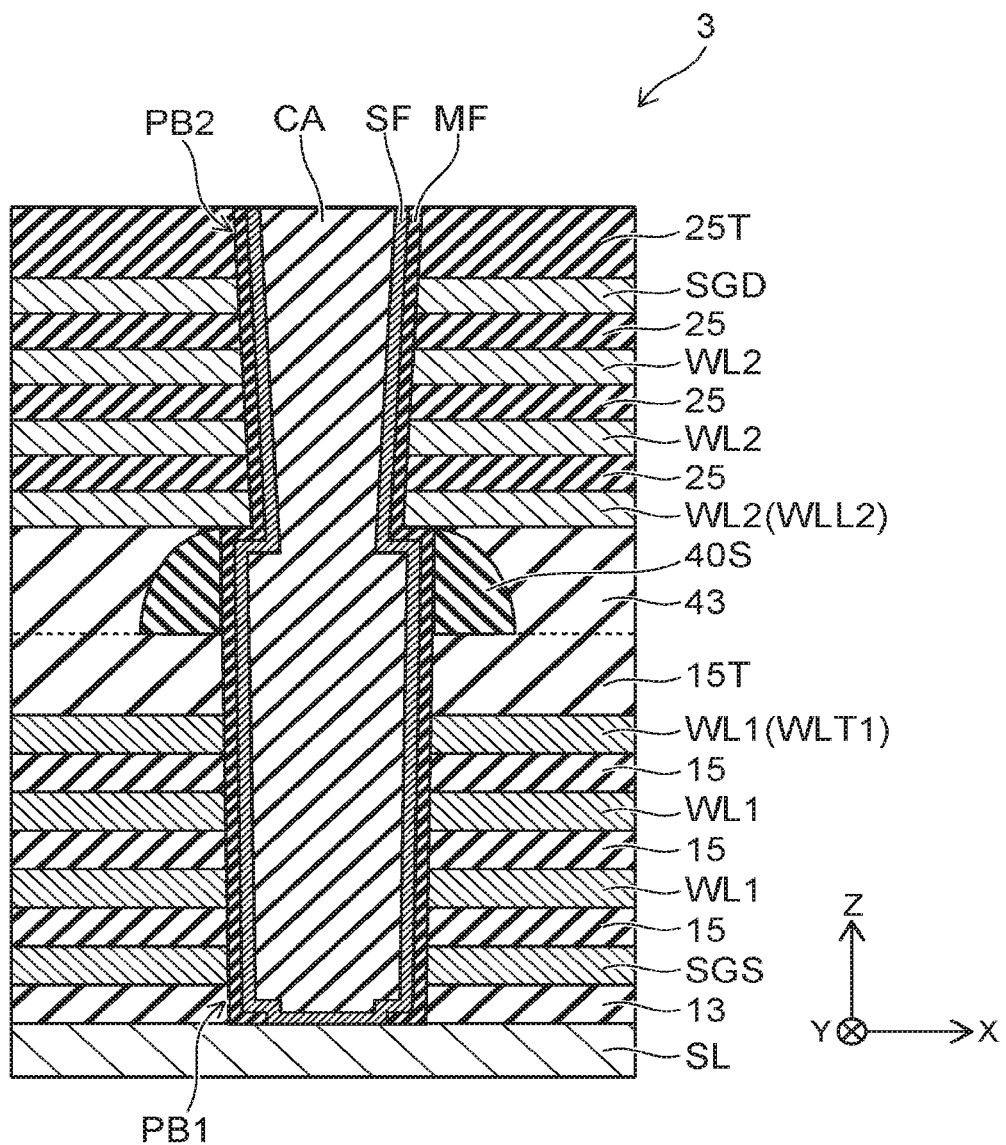
FIG. 12 is a schematic cross-sectional view showing a memory device according to a second embodiment.

FIG. 12 is a schematic cross-sectional view showing a memory device 3 according to a second embodiment. The cross-sectional structure of the columnar bodies PB1 and PB2 is shown in FIG. 12.

As shown in FIG. 12, the columnar body PB1 extends in the Z-direction and extends through the select gate SGS and the multiple word lines WL1 stacked in the Z-direction. The columnar body PB2 extends in the Z-direction and extends through the select gate SGD and the multiple word lines WL2 stacked in the Z-direction. The columnar body PB1 and the columnar body PB2 are connected between the word lines WLT1 and WLL2 which are positioned at the top of the multiple word lines WL1 and at the bottom of the multiple word lines WL2, respectively.

As shown in FIG. 12, the columnar bodies PB1 and PB2 include the memory film MF, the semiconductor film SF, and the insulating core CA. The memory film MF, the semiconductor film SF, and the insulating core CA extend in the Z-direction through the select gate SGS, the word lines WL1, the word lines WL2, and the select gate SGD. For example, the columnar bodies PB1 and PB2 are portions of a columnar body in which the memory film MF, the semiconductor film SF, and the insulating core CA are joined together. The columnar body PB1 is provided between the columnar body PB2 and the source layer SL. The semiconductor film SF is electrically connected to the source layer SL.

As shown in FIG. 12, an inter-layer insulating film 15T and an insulating film 43 are provided between the word line WLT1 and the word line WLL2. The insulating film 43 is provided between the inter-layer insulating film 15T and the word line WLL2. The columnar body PB1 extends in the Z-direction through the inter-layer insulating film 15T and the insulating film 43. The inter-layer insulating film 15T and the insulating film 43 are, for example, silicon oxide films.

A stopper film 40S is provided between the columnar body PB1 and the insulating film 43. For example, the stopper film 40S is provided to surround the columnar body PB1 in a cross section parallel to the upper surface of the word line WLT1 or the lower surface of the word line WLL2. For example, the stopper film 40S has a configuration in which the thickness in the Z-direction at a portion proximate to the columnar body PB1 is greater than the thickness in the Z-direction at a portion apart from the columnar body PB1. Moreover, the stopper film 40S has a lower surface contacting the inter-layer insulating film 15T. In the stopper film 40S, the width in the X-direction or the Y-direction of the lower surface is greater than the width in the X-direction or the Y-direction at the portion proximate to the word line WLL2.

The stopper film 40S includes, for example, a material different from those of the inter-layer insulating film 15T, the insulating film 43, and the sacrificial film 27 described below. The stopper film 40S may include, for example, a metal oxide such as aluminum oxide ($Al_2O_3$), hafnium oxide (HfO) or the like. The stopper film 40S may include silicon carbide (SiC), etc. When the inter-layer insulating film 15T and the insulating film 43 include other than silicon oxide, the stopper film 40S may include silicon oxide ($SiO_2$). Also, when the sacrificial film 27 (described below) includes other than silicon nitride (SiN), the stopper film 40S may include silicon nitride.

A method for manufacturing the memory device 3 according to the second embodiment will now be described with reference to FIGS. 13A to 14B. FIGS. 13A to 14B are schematic cross-sectional views showing manufacturing processes of the memory device 3 in order.

For example, the multiple sacrificial films 17 are stacked on the source layer SL with the inter-layer insulating films 13 and 15 interposed. The inter-layer insulating film 13 is provided between the source layer SL and the sacrificial film 17 positioned at the bottom. The inter-layer insulating films 15 and the sacrificial films 17 are alternately stacked on the inter-layer insulating film 13. Then, the memory hole MH1 is formed with a depth to the source layer SL from the upper surface of the inter-layer insulating film 15T at the top position so that the memory hole MH1 reaches the source layer SL; subsequently, the sacrificial film 33 that fills the interior of the memory hole MH1 is formed (referring to FIGS. 3A and 3B).

Figure 13A:
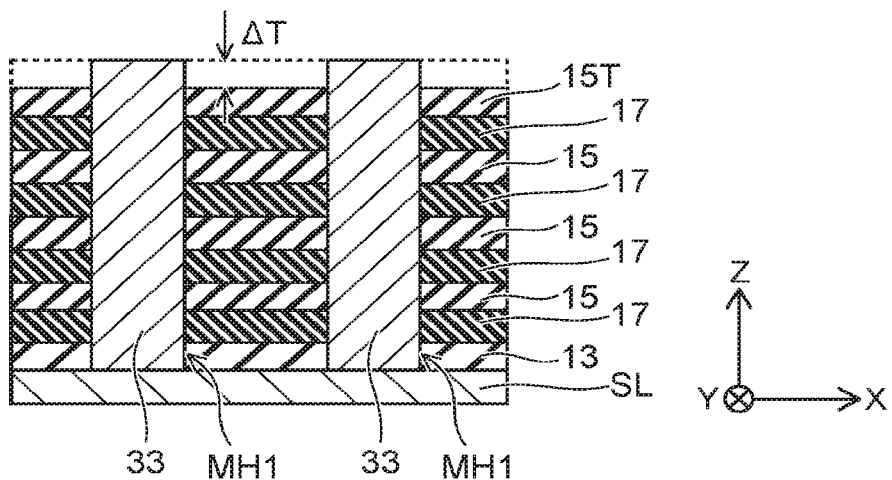
FIGS. 13A to 14B are schematic cross-sectional views showing manufacturing processes of the memory device according to the second embodiment.

Also, as shown in FIG. 13A, the sacrificial film 33 and the inter-layer insulating film 15T are partially removed so that the upper end of the sacrificial film 33 protrudes to a higher level than the inter-layer insulating film 15T. For example, after the portion of the sacrificial film 33 deposited at a higher level than the inter-layer insulating film 15T are selectively etched back, the inter-layer insulating film 15T is partially etched back.

Figure 13B:
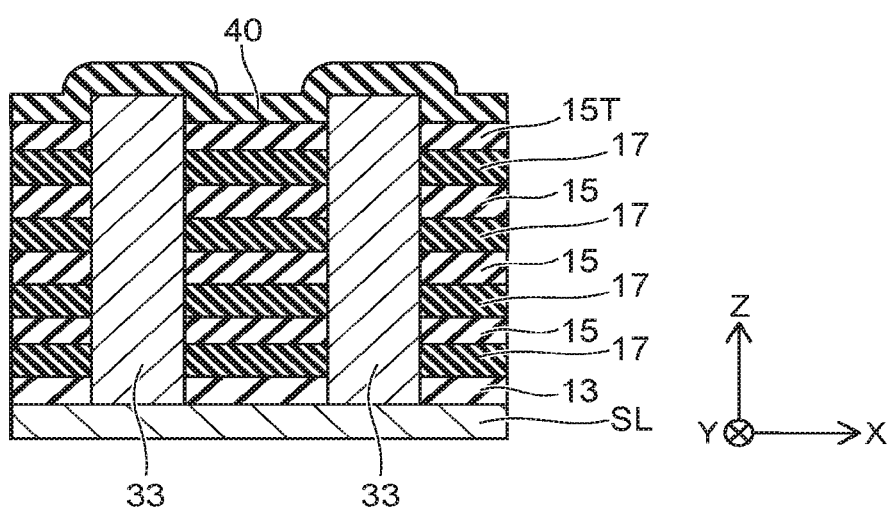

As shown in FIG. 13B, a stopper film 40 is formed on the inter-layer insulating film 15T. For example, the stopper film 40 is formed using CVD, and covers the upper end of the sacrificial film 33. For example, the sacrificial film 33 has the upper end (i.e., the portion protruding to the higher level than the inter-layer insulating film 15T) that has a width ΔT in the Z direction. The stopper film 40 has a thickness in the Z-direction about the same as the width ΔT.

Figure 13C:
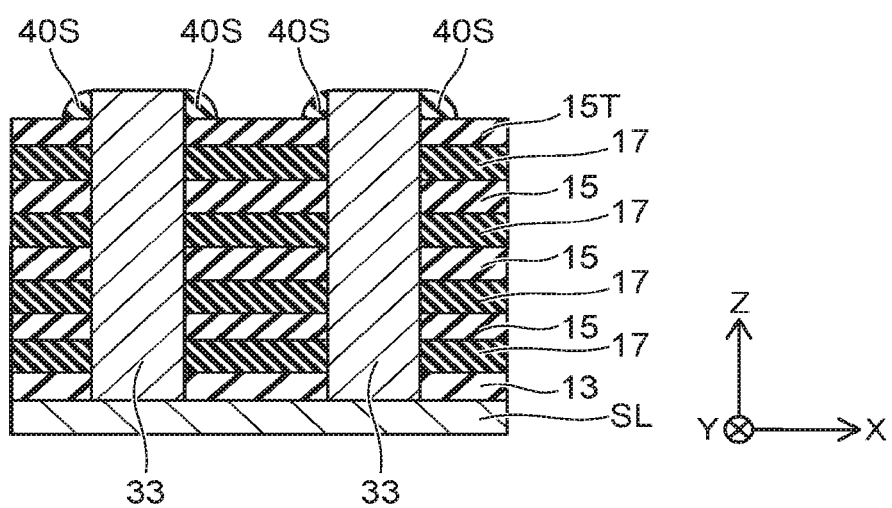

As shown in FIG. 13C, the stopper film 40 is etched back so that the portion thereof surrounding the upper end of the sacrificial film 33 remains. For example, the stopper film 40 is etched back using anisotropic RIE. Thereby, the stopper film 40S is formed around the upper end of the sacrificial film 33.

Figure 14A:
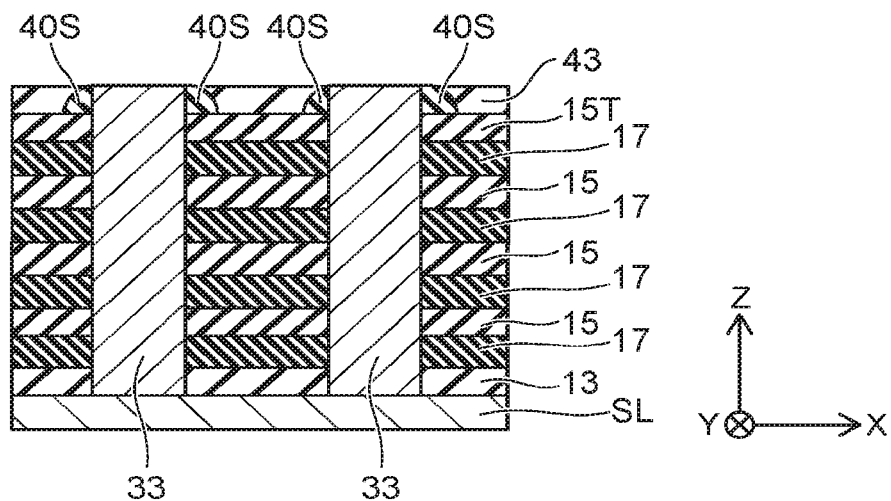

As shown in FIG. 14A, the insulating film 43 is formed on the inter-layer insulating film 15T. The insulating film 43 is formed so that the upper surface of the sacrificial film 33 is exposed to the outside. For example, the insulating film 43 is formed to cover the sacrificial film 33 and the stopper film 40S by using CVD, and subsequently is partially removed using CMP or is subjected to etch-back. The surface of the insulating film 43 is planarized in which the upper surface of the sacrificial film 33 is exposed.

Figure 14B:
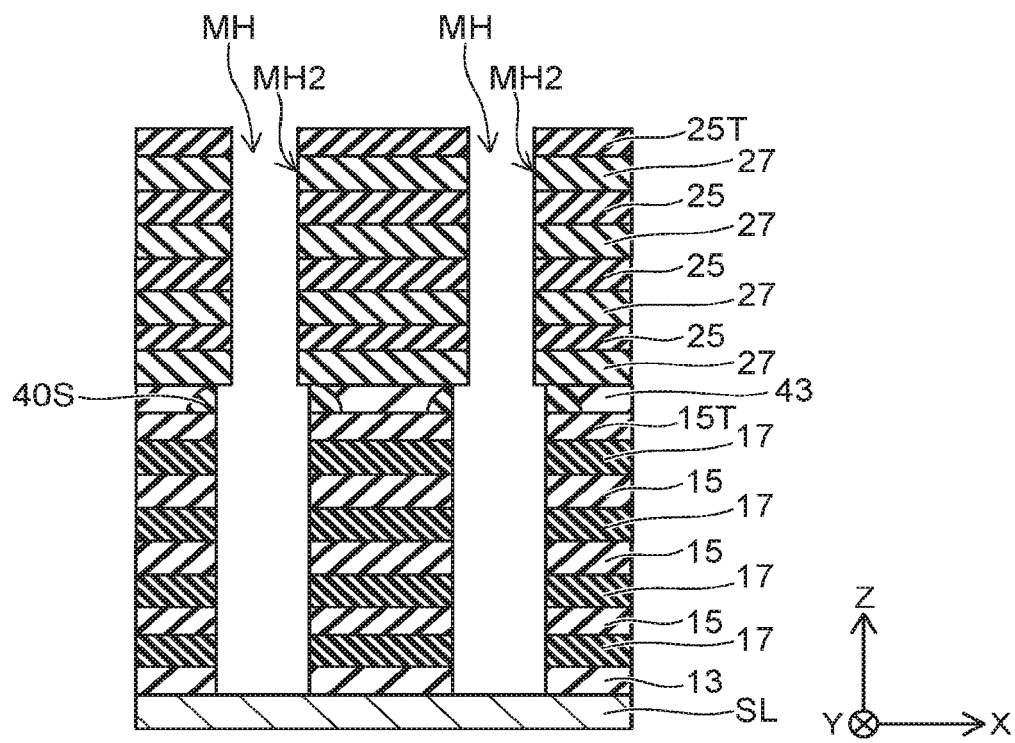

As shown in FIG. 14B, the multiple sacrificial films 27 are stacked on the insulating film 43 with the inter-layer insulating films 25 interposed. Subsequently, the memory hole MH is formed with a depth reaching the source layer SL. The inter-layer insulating films 25 and the sacrificial films 27 are alternately stacked on the insulating film 43.

Figure 15A:
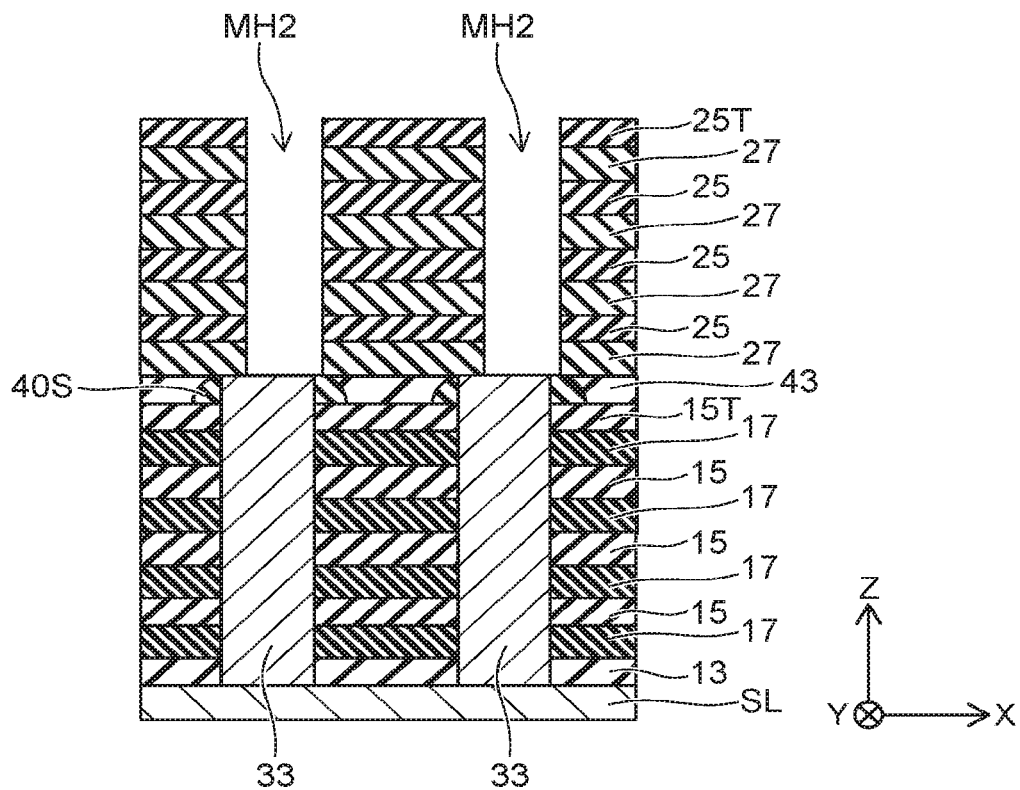
FIGS. 15A and 15B are schematic cross-sectional views showing characteristics of the memory device according to the second embodiment.

The memory hole MH is formed by selectively removing the sacrificial film 33 after forming the memory hole MH2 (referring to FIG. 15A). For example, the memory hole MH2 is formed with a depth reaching the sacrificial film 33 from the surface of the inter-layer insulating film 25T at the top position by selectively removing the inter-layer insulating film 25 and the sacrificial film 27.

Continuing, the memory film MF, the semiconductor film SF, and the insulating core CA are formed inside the memory hole MH. Also, the word lines WL1 and WL2 and the select gates SGS and SGD are formed by selectively removing the sacrificial films 17 and 27 and replacing the sacrificial films 17 and 27 with metal layers.

Figure 15B:
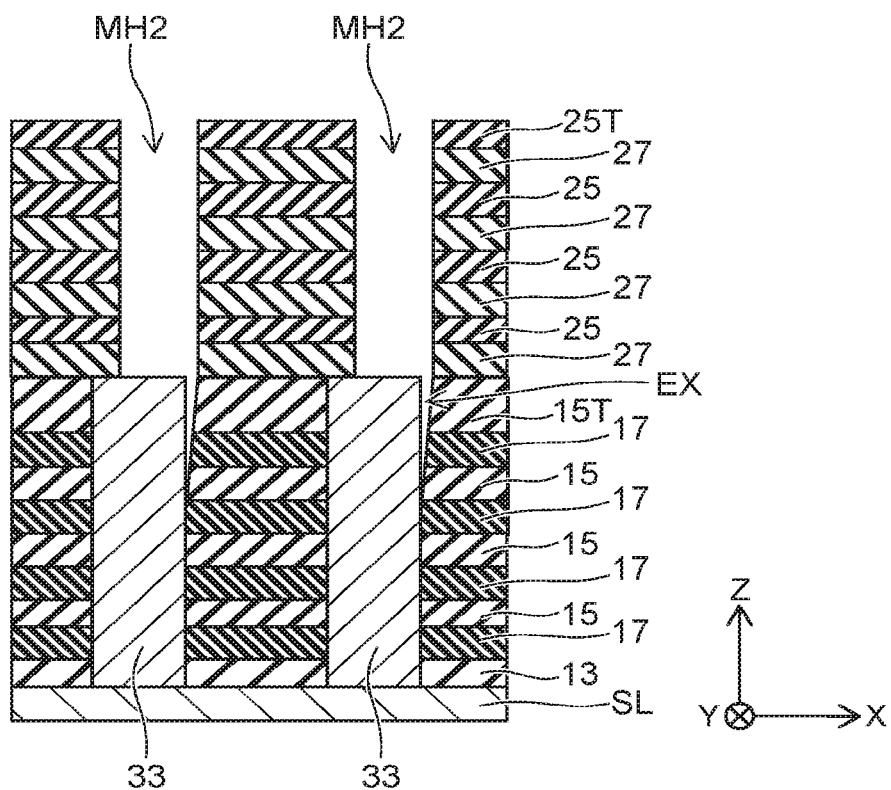

FIGS. 15A and 15B are schematic cross-sectional views showing characteristics of the memory device 3 according to the second embodiment. FIG. 15A is a schematic view showing a cross section of a stacked body including the sacrificial layers 17 and 27 after the memory hole MH2 is formed. FIG. 15B is a schematic view showing the configuration of the memory hole MH2 when the stopper film 40S is not provided.

The memory hole MH2 is formed to communicate with the sacrificial film 33. In many cases, the memory hole MH2 is formed so that the bottom surface of the memory hole MH2 is at a position shifted in the X-direction or the Y-direction from a position matching the upper surface of the sacrificial film 33 due to the precision of the alignment in the manufacturing processes.

In the memory device 3 according to the embodiment, the stopper film 40S and the upper surface of the sacrificial film 33 are exposed at the bottom surface of the memory hole MH2. The stopper film 40S is resistant to the etching conditions under which the memory hole MH2 is formed. The stopper film 40S protects the inter-layer insulating film 15T and the sacrificial films 17 provided below the stopper film 40S.

In contrast, when the stopper film 40S is not provided, there may be cases where the inter-layer insulating film 15T exposed at the bottom surface of the memory hole MH2 is etched as shown in FIG. 15B, and the sacrificial films 17 also are etched which are provided below the inter-layer insulating film 15T. As a result, the unintentionally etching of the inter-layer insulating film 15T and the sacrificial films 17 forms a region EX.

After the memory film MF is formed on the inner surface of the memory hole MH, in the process of selectively removing the portion of the memory film MF formed on the source layer SL, the portion thereof formed on the region EX also is etched or damaged (referring to FIG. 11A). Thereby, there may be cases where the semiconductor film SF and the word line WL1 are shorted or the reliability is reduced in the memory device 3.

Thus, the stopper film 40S prevents the etching of the inter-layer insulating film 15T and the sacrificial films 17 in the process of forming the memory hole MH2, and increases the manufacturing yield and the reliability of the memory device 3. The stopper film 40S includes a material that is resistant to the etching conditions under which the sacrificial films 27 is selectively removed. In other words, it is desirable for the stopper film 40S not to be etched in the process of replacing the sacrificial films 27 with the word lines WL2.

Figure 16:
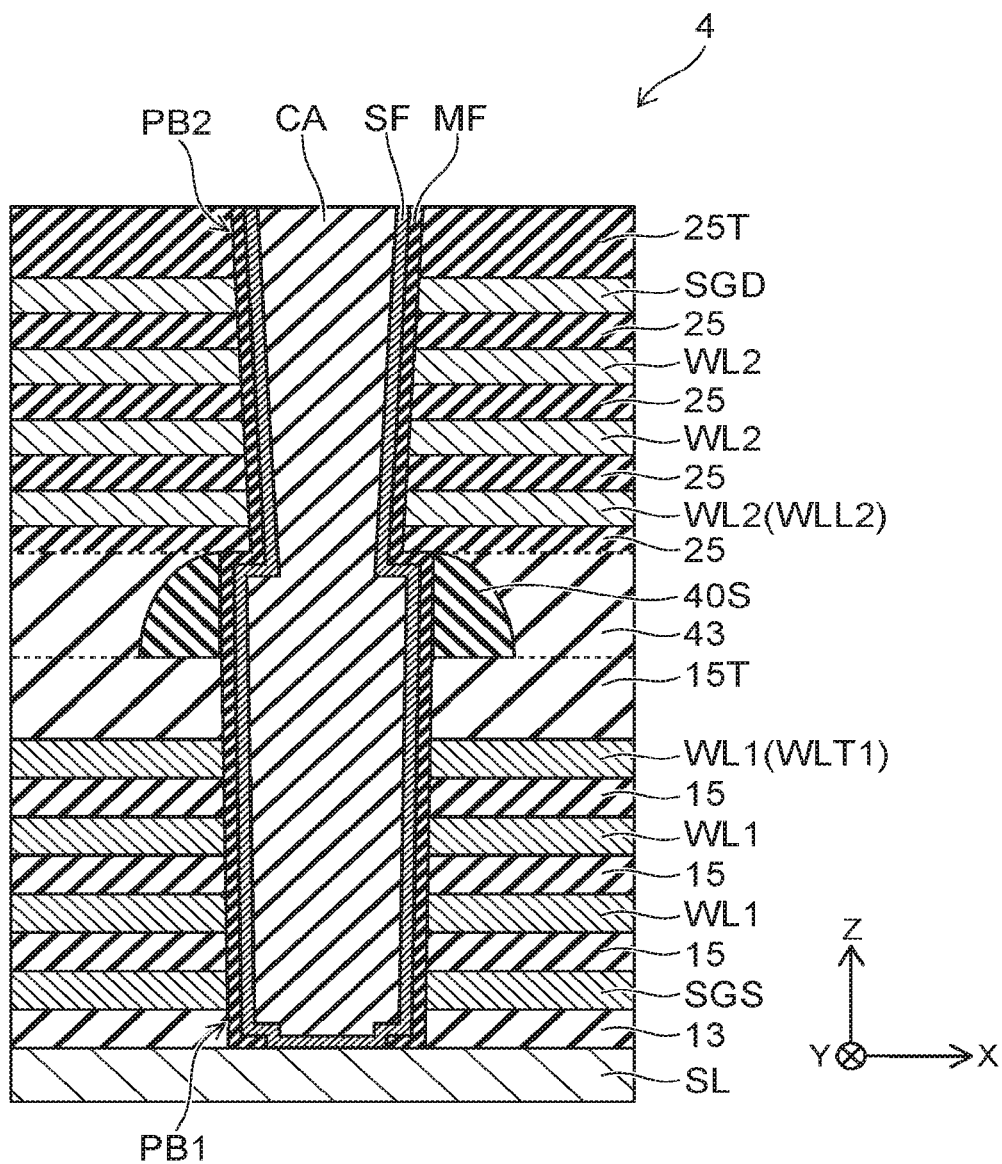
FIG. 16 is a schematic cross-sectional view showing a memory device according to a modification of the second embodiment.

FIG. 16 is a schematic cross-sectional view showing a memory device 4 according to a modification of the second embodiment. The cross-sectional structure of the columnar bodies PB1 and PB2 is shown in FIG. 16.

As shown in FIG. 16, the columnar body PB1 extends in the Z-direction through the select gate SGS and the multiple word lines WL1. The columnar body PB2 extends in the Z-direction through the multiple word lines WL2 and the select gate SGD. The columnar body PB1 and the columnar body PB2 are connected between the word line WLT1 and the word line WLL2. The stopper film 40S is provided to surround the upper end of the columnar body PB1.

In the example, the word line WLL2 is provided at a position apart from the stopper film 40S. For example, the inter-layer insulating film 25 is provided between the word line WLL2 and the stopper film 40S and between the word line WLL2 and the insulating film 43.

Such a structure is formed by, for example, stacking a sacrificial film 27 (referring to FIGS. 14A and 14B) after an inter-layer insulating film 25 is formed on the insulating film 43. Thereby, it is possible to prevent the stopper film 40S from the etching in the process of replacing the sacrificial films 27 with the word lines WL2. The stopper film 40S can include, for example, the same material as the sacrificial film 27. In the example, when the sacrificial film 27 includes silicon nitride, the stopper film 40S can include silicon nitride (SiN). Moreover, polysilicon or amorphous silicon with an impurity added may be used as the material of the stopper film 40S, because the stopper film 40S is electrically insulated from the word line WLL2 by the inter-layer insulating film 25.

Third Embodiment

Figure 17:
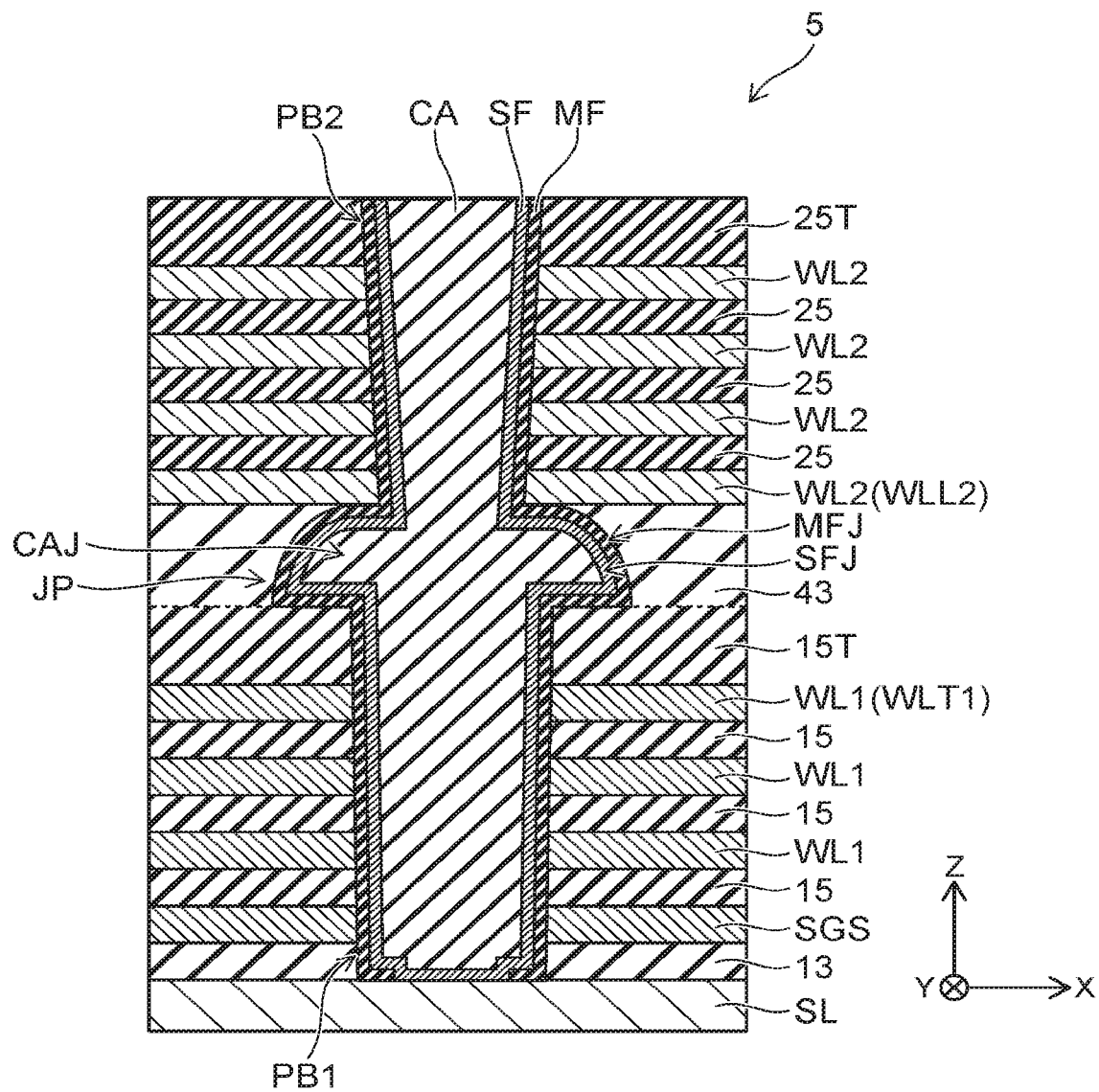
FIG. 17 is a schematic cross-sectional view showing a memory device according to a third embodiment.

FIG. 17 is a schematic cross-sectional view showing a memory device 5 according to a third embodiment. The cross-sectional structure of the columnar bodies PB1 and PB2 is shown in FIG. 17.

As shown in FIG. 17, the columnar body PB1 extends in the Z-direction through the select gate SGS and the multiple word lines WL1. The columnar body PB2 extends in the Z-direction through the multiple word lines WL2 and the select gate SGD. The columnar body PB1 and the columnar body PB2 are connected between the word line WLT1 and the word line WLL2.

In the example, the connection part JP is provided between the word line WLT1 and the word line WLL2. The connection part JP includes an enlarged portion MFJ of the memory film MF, an enlarged portion SFJ of the semiconductor film SF, and an enlarged portion CAJ of the insulating core CA. For example, the connection part JP has a structure in which the upper end of the columnar body PB1 is enlarged in the X-direction and the Y-direction. For example, the connection part JP is positioned between the inter-layer insulating film 15T and the word line WLL2.

For example, the connection part JP is surrounded with the insulating film 43 in a cross section parallel to the upper surface of the word line WLT1 or the lower surface of the word line WLL2. Also, for example, the connection part JP has a configuration in which the thickness in the Z-direction of a portion positioned inward is greater than the thickness in the Z-direction of a portion positioned at the outer edge. The connection part JP has a lower surface contacting the inter-layer insulating film 15T. In the connection part JP, the width in the X-direction or the Y-direction of the lower surface is greater than the width in the X-direction or the Y-direction at a portion proximate to the word line WLL2.

A method for manufacturing the memory device 5 according to the third embodiment will now be described with reference to FIGS. 18A to 19B. FIGS. 18A to 19B are schematic cross-sectional views showing manufacturing processes of the memory device 5 in order.

Figure 18A:
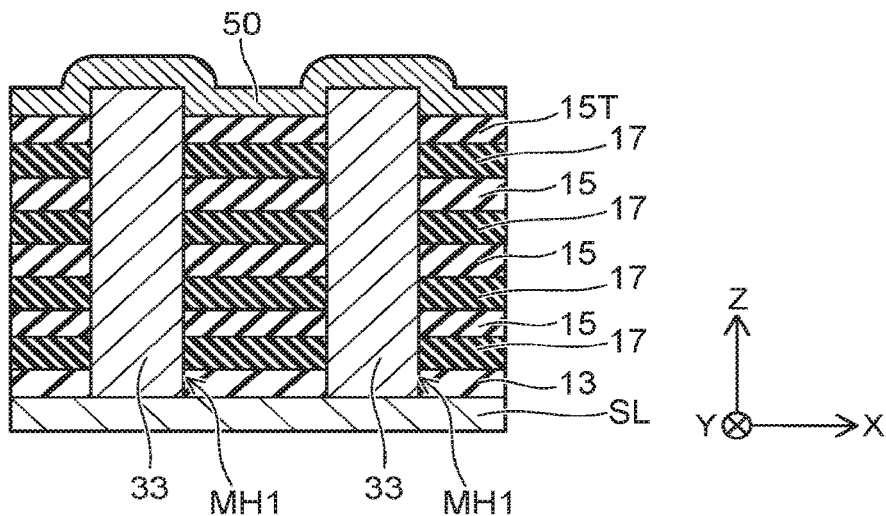
FIGS. 18A to 19B are schematic cross-sectional views showing manufacturing processes of the memory device according to the third embodiment.

As shown in FIG. 18A, the multiple sacrificial films 17 are stacked on the source layer SL with the inter-layer insulating films 13 and 15 interposed. Then, the memory hole MH1 is formed with a depth reaching the source layer SL from the surface of the inter-layer insulating film 25T at the top position. Subsequently, the sacrificial film 33 that fills the interior of the memory hole MH1 is formed. As a result, the sacrificial film 33 is provided to extend in the Z-direction through the inter-layer insulating films 13 and 15 and the sacrificial film 17 stacked on the source layer SL.

Also, a portion of the sacrificial film 33 and a portion of the inter-layer insulating film 15T are removed so that the upper end of the sacrificial film 33 protrudes to a higher level than the inter-layer insulating film 15T. Then, a sacrificial film is formed on the inter-layer insulating film 15T. The sacrificial film 50 is, for example, an amorphous silicon film formed using CVD and covers the upper end of the sacrificial film 33. For example, the sacrificial film 50 has a thickness in the Z-direction that is about the same as the width in the Z-direction of the portion of the sacrificial film 33 protruding to the higher level than the inter-layer insulating film 15T.

Figure 18B:
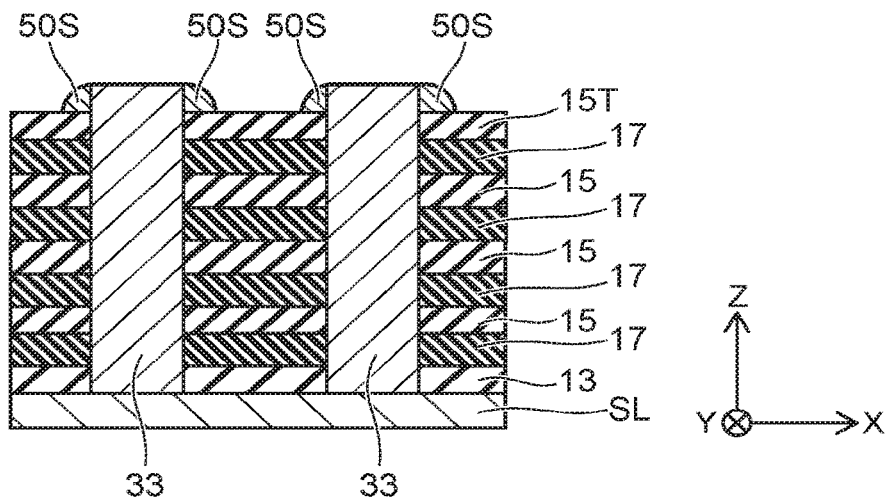

As shown in FIG. 18B, the sacrificial film 50 is etched back so that the portion thereof surrounding the upper end of the sacrificial film 33 remains. For example, the sacrificial film 50 is etched back using anisotropic RIE. Thereby, a sacrificial film 50S is formed around the upper end of the sacrificial film 33.

Figure 18C:
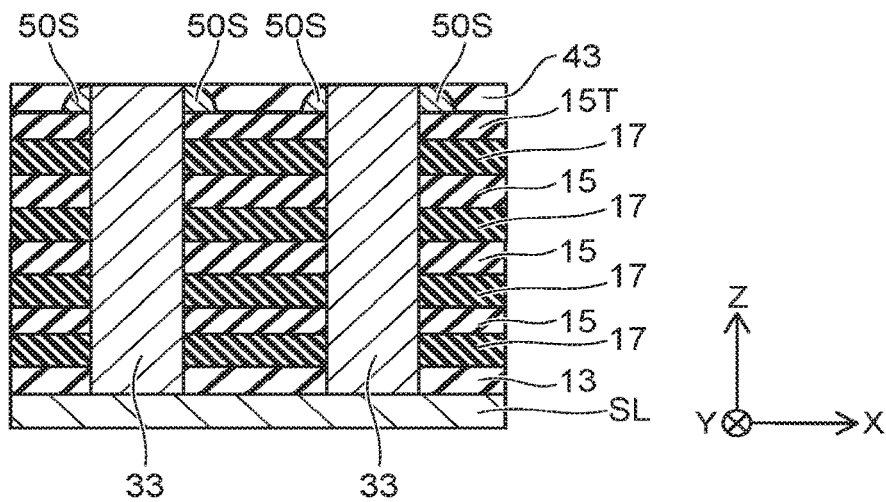

As shown in FIG. 18C, the insulating film 43 is formed on the inter-layer insulating film 15T. The insulating film 43 is formed so that the upper surface of the sacrificial film 33 is exposed to the outside. For example, the insulating film 43 is partially removed using CMP or is subjected to etch-back after the insulating film 43 is formed to cover the sacrificial film 33 and the sacrificial film 50S by using CVD. The surface of the insulating film 43 is planarized in which the upper surface of the sacrificial film 33 is exposed.

Figure 19A:
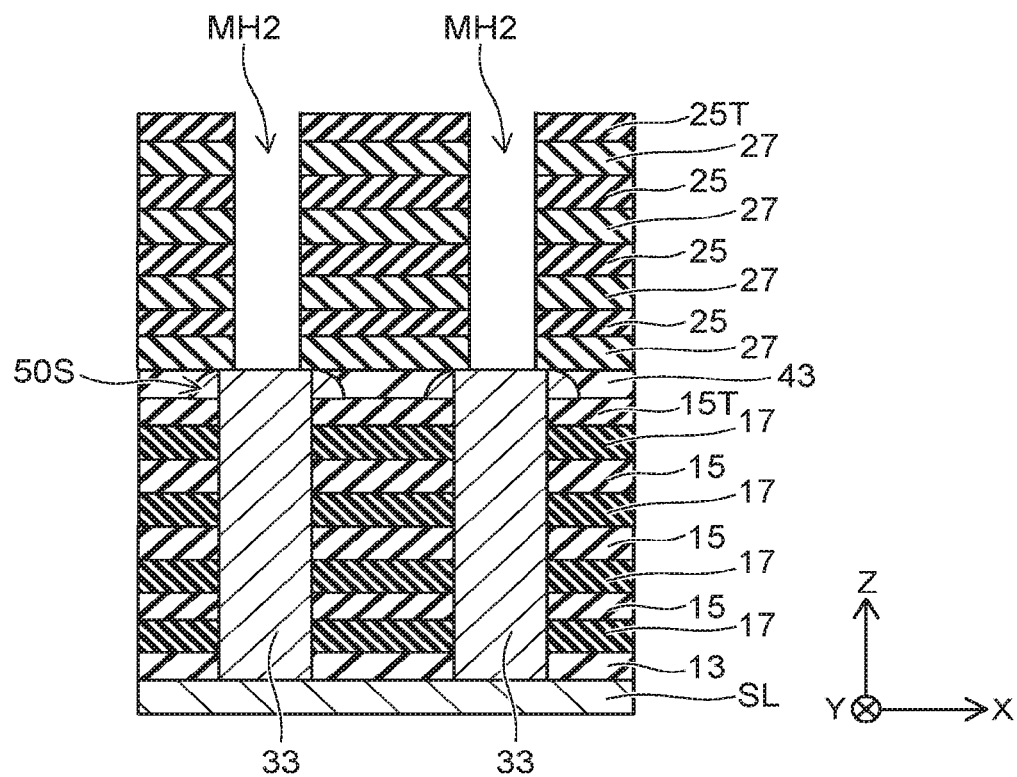

As shown in FIG. 19A, the multiple sacrificial films 27 are stacked on the insulating film 43 with the inter-layer insulating films 25 interposed. The inter-layer insulating film 25 and the sacrificial film 27 are alternately stacked on the insulating film 43. Subsequently, the memory hole MH2 is formed from the surface of the inter-layer insulating film 25T at the top position so that the memory hole MH2 is in communication with the sacrificial film 33.

The sacrificial film 50S protects the inter-layer insulating film 15T and the sacrificial films 17 provided below the sacrificial film 50S in the process of forming the memory hole MH2. Thereby, the etching of the inter-layer insulating film 15T and the sacrificial films 17 can be prevented when the bottom surface of the memory hole MH2 is shifted from a position matching the upper surface of the sacrificial film 33 due to the misalignment of the memory hole MH2 (referring to FIG. 15B).

Figure 19B:
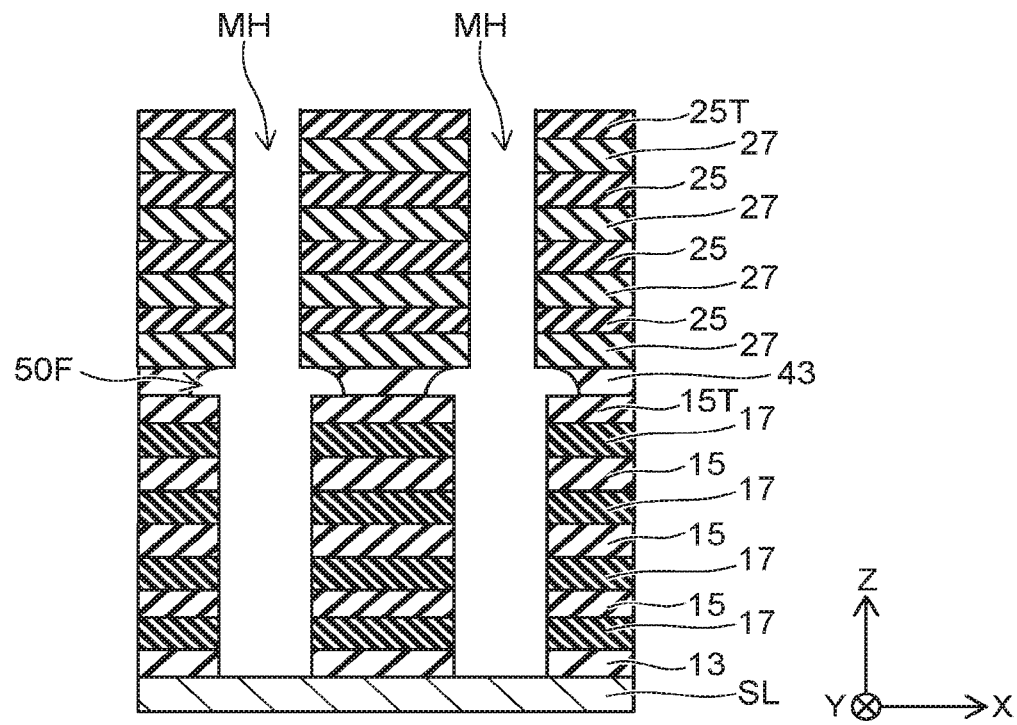

As shown in FIG. 19B, the memory hole MH is formed with a depth reaching the source layer SL from the upper surface of the inter-layer insulating film 25T. For example, the memory hole MH is formed by selectively removing the sacrificial film 33. The memory hole MH includes an enlarged region 50F between the inter-layer insulating film 15T and the sacrificial film 27 at the bottom position. The enlarged region 50F is formed by selectively removing the sacrificial film 50S simultaneously with the sacrificial film 33.

Continuing, the memory film MF, the semiconductor film SF, and the insulating core CA are formed inside the memory hole MH. The memory film MF includes the enlarged portion MFJ formed along the inner surface of the enlarged region 50F of the memory hole MH. The semiconductor film SF includes the enlarged portion SFJ formed on the enlarged portion MFJ of the memory film MF. The insulating core CA includes the enlarged portion CAJ that fills the space in the enlarged region 50F. Also, the word lines WL1 and WL2 and the select gates SGS and SGD are formed by selectively removing the sacrificial films 17 and 25 and replacing the sacrificial films 17 and 25 with metal layers.

In the embodiment, by providing the connection part JP including the enlarged portions MFJ, SFJ, and CAJ, the manufacturing yield can be increased and the reliability is improved in the memory device 5.

Fourth Embodiment

Figure 20:
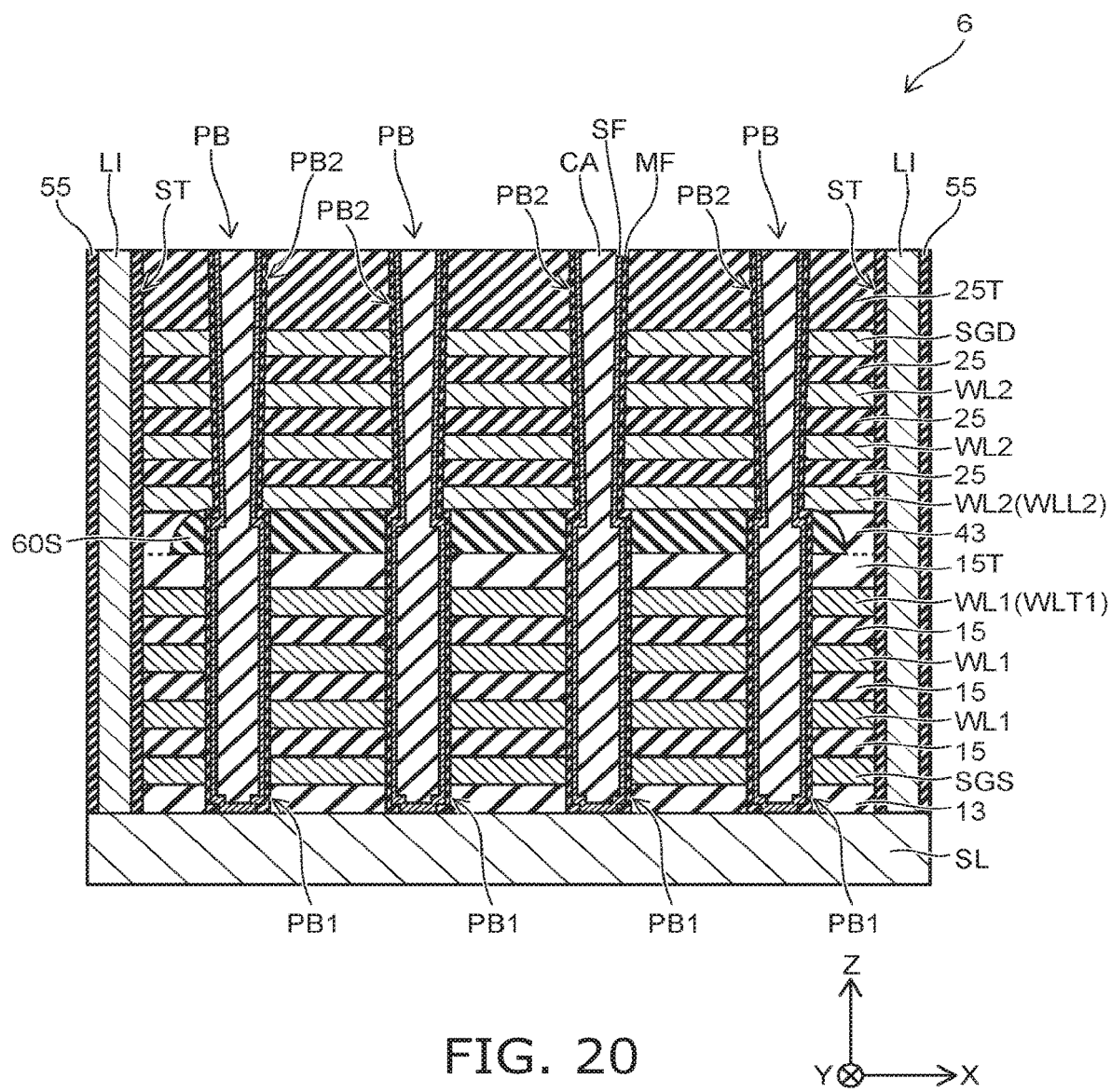
FIG. 20 is a schematic cross-sectional view showing a memory device according to a fourth embodiment.

FIG. 20 is a schematic cross-sectional view showing a memory device 6 according to a fourth embodiment. FIG. 20 shows a cross section of a stacked body including the select gate SGS, the word lines WL1, the word lines WL2, and the select gate SGD. The cross section shown in FIG. 20 includes the cross section of a columnar body PB.

As shown in FIG. 20, the select gate SGS, the word lines WL1, the word lines WL2, and the select gate SGD are stacked on the source layer SL with the inter-layer insulating films 13, 15, and 25 interposed. Multiple stacked bodies that include the select gate SGS, the word lines WL1, the word lines WL2, and the select gate SGD are provided and arranged in, for example, the X-direction. The stacked bodies are separated from each other by a slit ST. For example, a connection conductor LI is provided inside the slit ST. The connection conductor LI is electrically insulated from the select gate SGS, the word lines WL1, the word lines WL2, and the select gate SGD by an insulating film 55 covering the inner wall of the slit ST. Also, the connection conductor LI is electrically connected to the source layer SL. The source layer SL is connected to a control circuit (not illustrated) via the connection conductor LI.

The columnar body PB extends in the Z-direction through the select gate SGS, the word lines WL1, the word lines WL2, and the select gate SGD. The columnar body PB includes, for example, the memory film MF, the semiconductor film SF, and the insulating core. The columnar body PB includes the columnar body PB1 and the columnar body PB2. The columnar body PB1 extends in the Z-direction through the select gate SGS and the multiple word lines WL1. The columnar body PB2 extends in the Z-direction through the multiple word lines WL2 and the select gate SGD. The columnar body PB1 and the columnar body PB2 are connected between the word line WLT1 and the word line WLL2.

In the example, a stopper film 60S is provided between the word line WLT1 and the word line WLL2. For example, the stopper film 60S is selectively provided in the region where the multiple columnar bodies PB are disposed. The columnar bodies PB are provided to extend through the stopper film 60S. For example, the stopper film 60S is not provided in the region where contact plugs (not illustrated) that connect the word lines WL1 and WL2 to a control circuit (not illustrated) are disposed, nor in the region divided by the slit ST.

The stopper film 60S can include a metal oxide such as aluminum oxide ($Al_2O_3$), hafnium oxide (HfO), tungsten oxide ($WO_X$), titanium oxide (TiO), etc. Also, the stopper film 60S can include, for example, silicon nitride (SiN) or silicon carbide (SiC). When the inter-layer insulating film 15T and the insulating film 43 are not silicon oxide films, the stopper film 60S may include silicon oxide ($SiO_2$).

A method for manufacturing the memory device 6 according to the fourth embodiment will now be described with reference to FIGS. 21A to 22B. FIGS. 21A to 22B are schematic cross-sectional views showing manufacturing processes of the memory device 6 according to the fourth embodiment in order.

Figure 21A:
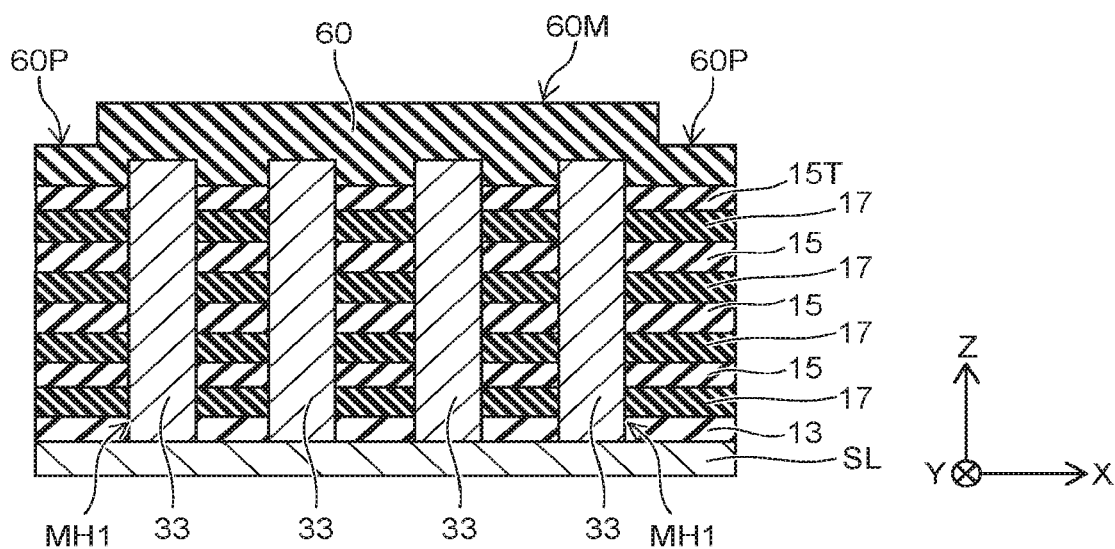
FIGS. 21A to 22B are schematic cross-sectional views showing manufacturing processes of the memory device according to the fourth embodiment.

As shown in FIG. 21A, the sacrificial film 33 extends in the Z-direction and extends through the sacrificial films 17 stacked on the source layer SL with the inter-layer insulating films 13 and 15 interposed. The sacrificial film 33 is provided so that the upper end of the sacrificial film 33 protrudes to a higher level than the inter-layer insulating film 15T. Then, a stopper film 60 is formed on the inter-layer insulating film 15T. The stopper film 60 is formed to cover the upper end of the sacrificial film 33.

The stopper film 60 includes a stopper film 60M and a stopper film 60P. The stopper film 60M is formed in the region where the multiple sacrificial films 33 are provided; and the stopper film 60P is provided at the periphery of the region. For example, the thickness in the Z-direction of the stopper film 60M is greater than the thickness in the Z-direction of the stopper film 60P. For example, after forming the stopper film 60 on the insulating film 43 with a uniform thickness, the stopper film 60P is formed by selectively thinning the stopper film 60 at the region other than the portion where the sacrificial films 33 are provided.

Figure 21B:
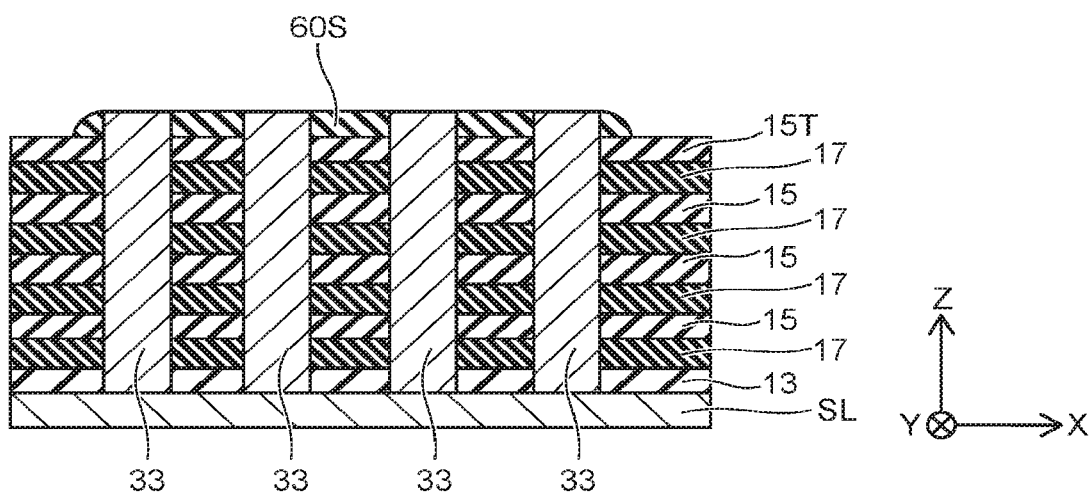

As shown in FIG. 21B, the stopper film 60 is etched back so that the portion thereof remains at the region where the sacrificial films 33 are provided. For example, the stopper film 60 is etched back using RIE. Thereby, the stopper film 60S is formed around the upper ends of the sacrificial films 33. The stopper film 60S is formed to cover the region where the multiple sacrificial films 33 are formed so that the upper surfaces of the sacrificial films 33 are exposed at the surface of the stopper film 60S.

Figure 21C:
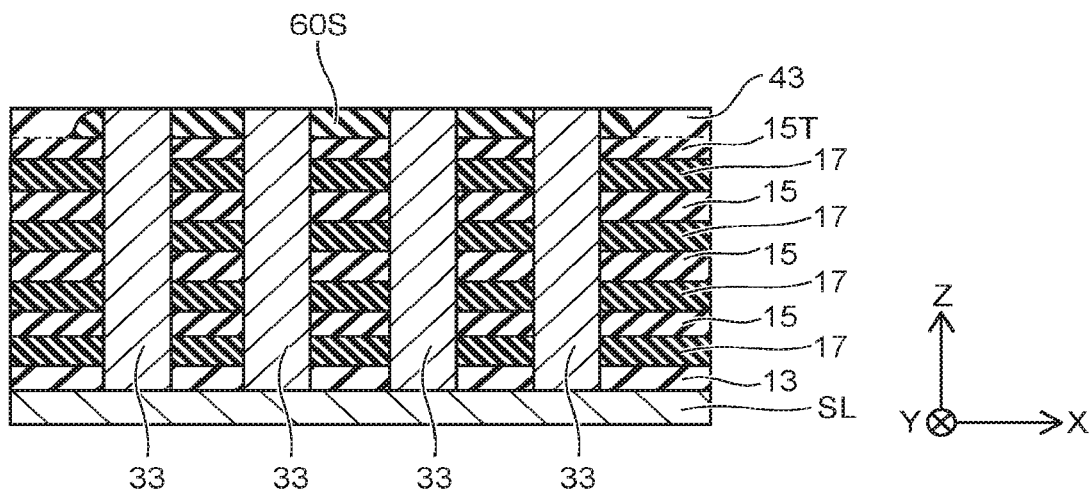

As shown in FIG. 21C, the insulating film 43 is formed on the inter-layer insulating film 15T. The insulating film 43 is formed so that the upper surfaces of the sacrificial films 33 and the upper surface of the stopper film 60S are exposed. For example, the insulating film 43 is partially removed using CMP or subjected to etch-back after being formed to cover the sacrificial film 33 and the stopper film 60S by using CVD. The surface of the insulating film 43 is planarized in which the upper surfaces of the sacrificial films 33 and the upper surface of the stopper film 60S are exposed.

Figure 22A:
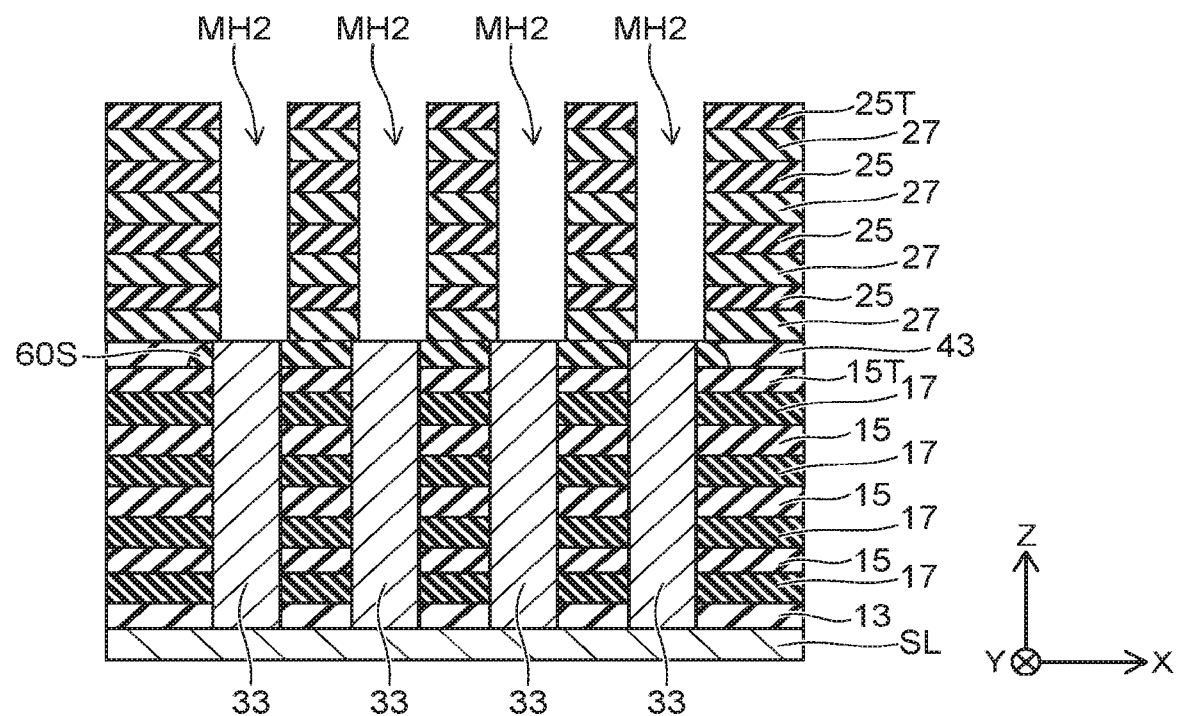

As shown in FIG. 22A, the multiple sacrificial films 27 are stacked on the sacrificial film 33, the stopper film 60S, and the insulating film 43 with the inter-layer insulating films 25 interposed. The inter-layer insulating film 25 and the sacrificial film 27 are alternately stacked. Subsequently, the memory hole MH2 is formed from the surface of the inter-layer insulating film 25T at the top position so that the memory hole MH2 communicates with the sacrificial film 33.

The stopper film 60S protects the inter-layer insulating film 15T and the sacrificial films 17 provided below the stopper film 60S in the process of forming the memory hole MH2. Thereby, the inter-layer insulating film 15T and the sacrificial films 17 can be prevented from being etched when the bottom surface of the memory hole MH2 is shifted from a position matching the upper surface of the sacrificial film 33 due to the misalignment of the memory hole MH2 (referring to FIG. 15B).

Figure 22B:
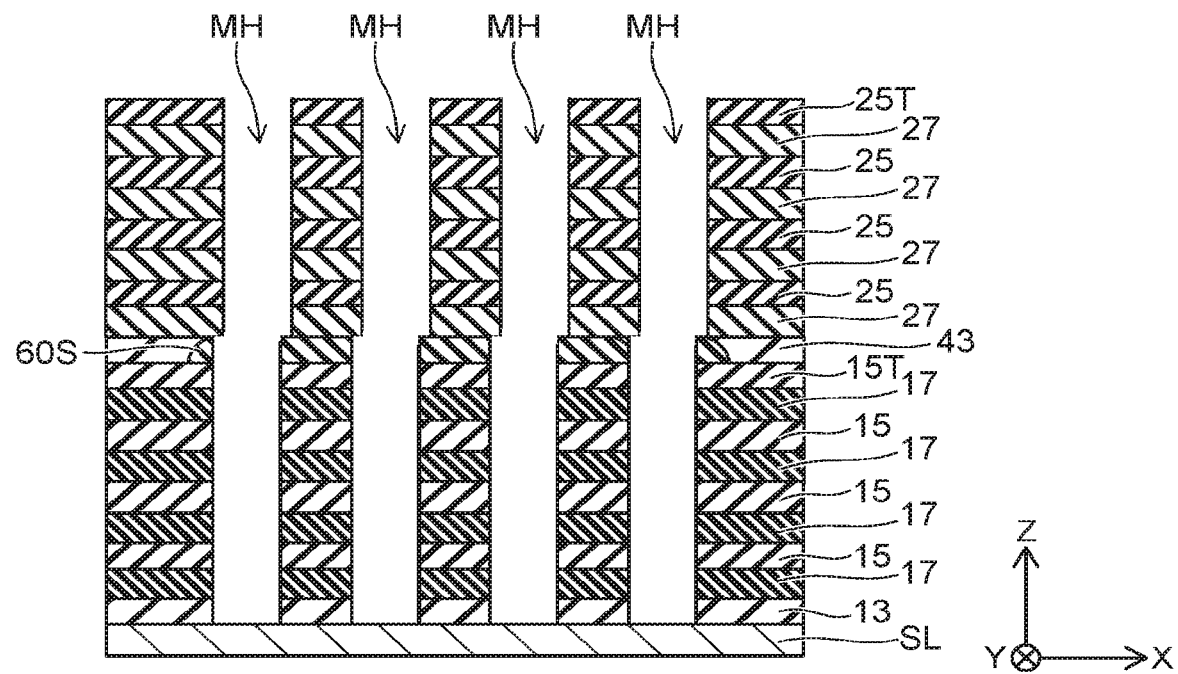

As shown in FIG. 22B, the memory hole MH is formed with a depth reaching the source layer SL from the upper surface of the inter-layer insulating film 25T. For example, the memory hole MH is formed by selectively removing the sacrificial film 33.

Continuing, the memory film MF, the semiconductor film SF, and the insulating core CA are formed inside the memory hole MH. Also, the word lines WL1 and WL2 and the select gates SGS and SGD are formed by selectively removing the sacrificial films 17 and 25 and replacing the sacrificial films 17 and 25 with metal layers.

Figure 23:
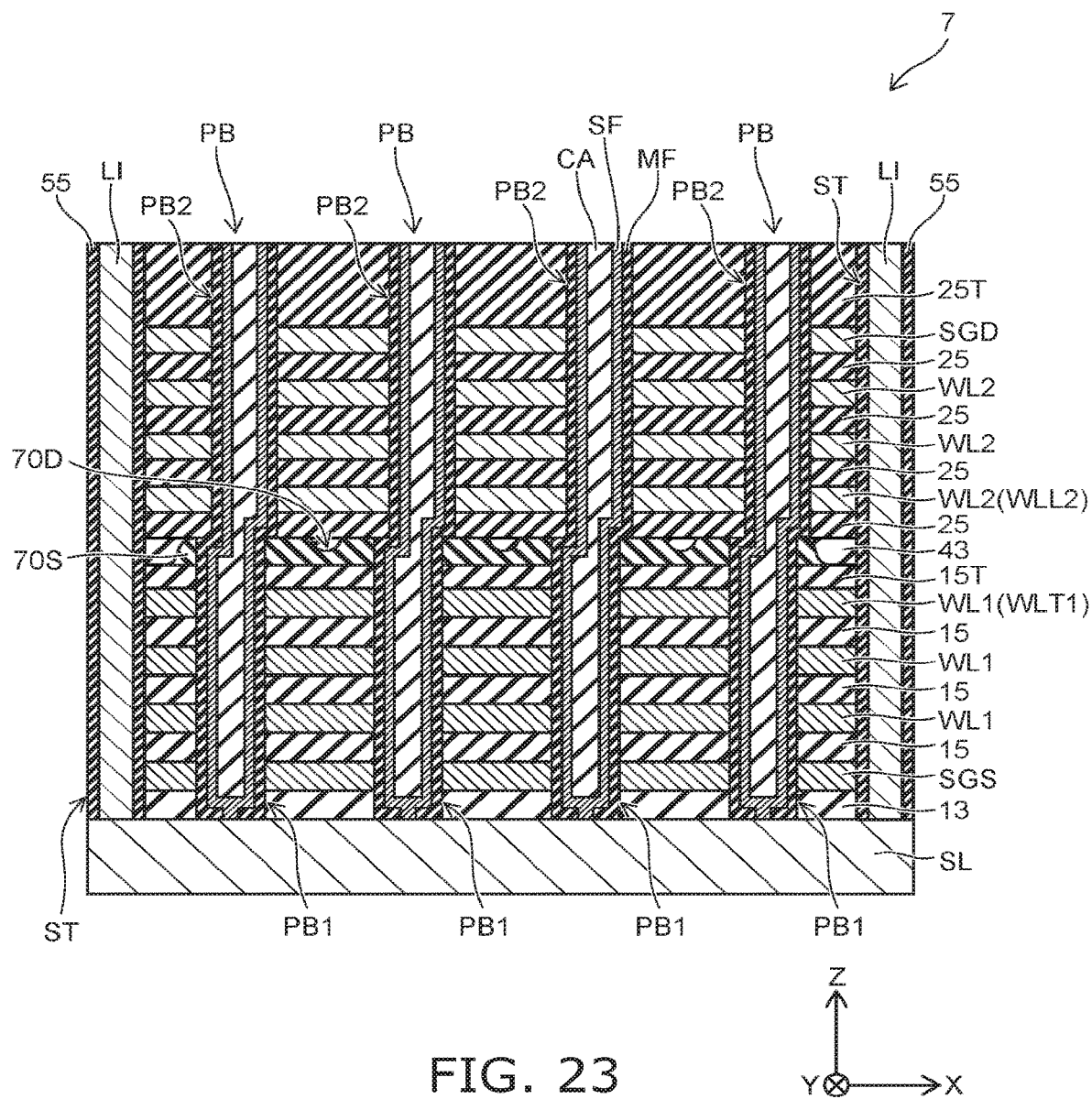
FIG. 23 is a schematic cross-sectional view showing a memory device according to a modification of the fourth embodiment.

FIG. 23 is a schematic cross-sectional view showing a memory device 7 according to a modification of the fourth embodiment. FIG. 23 shows a cross-sectional structure of a stacked body including the select gate SGS, the word lines WL1, the word lines WL2, and the select gate SGD. The cross section of the columnar body PB also is illustrated in FIG. 23.

As shown in FIG. 23, the select gate SGS, the word lines WL1, the word lines WL2, and the select gate SGD are stacked on the source layer SL with the inter-layer insulating films 13, 15, and 25 interposed. Multiple stacked bodies including the select gate SGS, the word lines WL1, the word lines WL2 and the select gate SGD are provided and arranged in, for example, the X-direction. The stacked bodies are separated from each other by the slit ST. For example, the connection conductor LI is provided inside the slit ST. The connection conductor LI is electrically insulated from the select gate SGS, the word lines WL1, the word lines WL2, and the select gate SGD by the insulating film 55 covering the inner wall of the slit ST. Moreover, the connection conductor LI is electrically connected to the source layer SL. The source layer SL is connected to the control circuit via the connection conductor LI.

The columnar body PB extends in the Z-direction through the select gate SGS, the word lines WL1, the word lines WL2, and the select gate SGD. The columnar body PB includes, for example, the memory film MF, the semiconductor film SF, and the insulating core. The columnar body PB includes the columnar body PB1 and the columnar body PB2. The columnar body PB1 extends in the Z-direction through the select gate SGS and the multiple word lines WL1. The columnar body PB2 extends in the Z-direction through the multiple word lines WL2 and the select gate SGD. The columnar body PB1 and the columnar body PB2 are connected between the word line WLT1 and the word line WLL2.

In the example, a stopper film 70S is provided between the word line WLT1 and the word line WLL2. For example, the stopper film 70S is selectively provided in the region where the multiple columnar bodies PB are disposed. The columnar body PB is provided to extend through the stopper film 70S. The stopper film 70S includes, for example, a recess 70D positioned between adjacent columnar bodies PB.

The stopper film 70S can include a metal oxide such as aluminum oxide ($Al_2O_3$), hafnium oxide (HfO), tungsten oxide ($Wo_x$), titanium oxide (TiO), etc. Also, the stopper film 70S may include a semiconductor such as polysilicon or amorphous silicon doped with an impurity. Also, the stopper film 70S can include, for example, silicon nitride (SiN) or silicon carbide (SIC). When the inter-layer insulating film 15T and the insulating film 43 are not silicon oxide films, the stopper film 70S may include silicon oxide ($SiO_2$).

A method for manufacturing the memory device 7 according to the modification of the fourth embodiment will now be described with reference to FIGS. 24A to 26B. FIGS. 24A to 26B are schematic views showing manufacturing processes of the memory device 7 in order. FIGS. 24A to 24C and FIGS. 26A and 26B are cross-sectional views showing a cross section along line K-K shown in FIG. 25. FIG. 25 is a plan view.

Figure 24A:
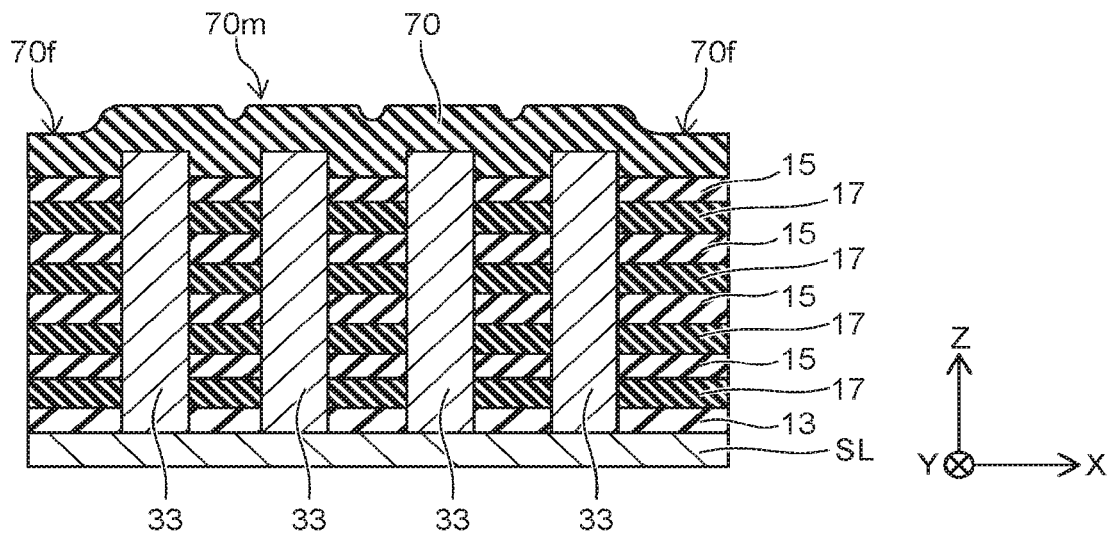
FIGS. 24A to 26B are schematic views showing manufacturing processes of the memory device according to the modification of the fourth embodiment.
Figure 25:
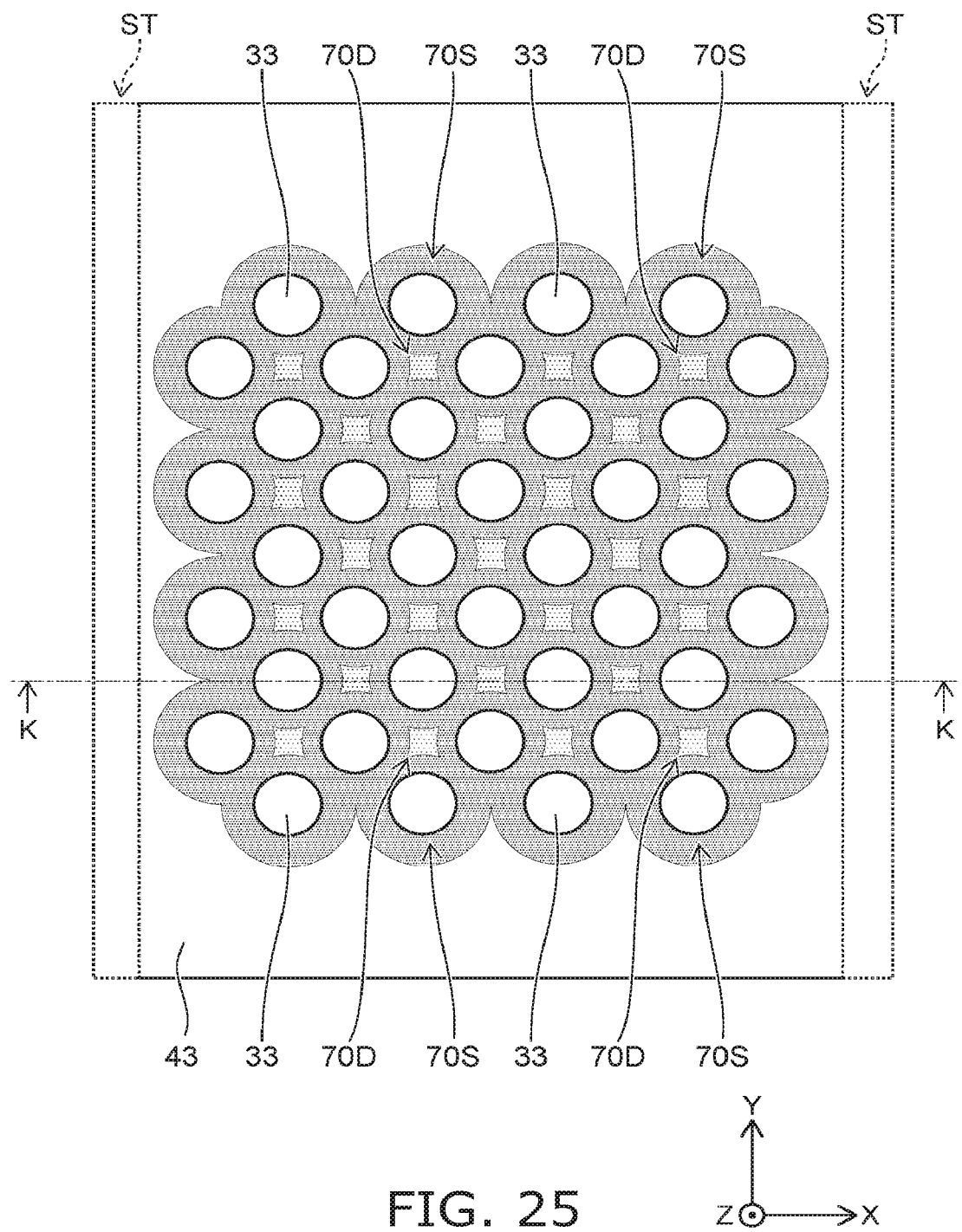

As shown in FIG. 24A, the sacrificial film 33 extends in the Z-direction and extends through the multiple sacrificial films 17 stacked on the source layer SL with the inter-layer insulating films 13 and 15 interposed. The sacrificial film 33 is provided so that the upper end of the sacrificial film 33 protrudes to a higher level than the inter-layer insulating film 15T. Then, a stopper film 70 is formed on the inter-layer insulating film 15T. The stopper film 70 is formed to cover the upper end of the sacrificial film 33.

The stopper film 70 includes a portion 70m positioned between the sacrificial films 33 and a portion 70f positioned at a region where the sacrificial film 33 is not provided. For example, when the spacing between the adjacent sacrificial films 33 is narrow, the stopper film 70 is formed so that the thickness in the Z-direction of a portion 70m is greater than the thickness in the Z-direction of a portion 70f.

Figure 24B:
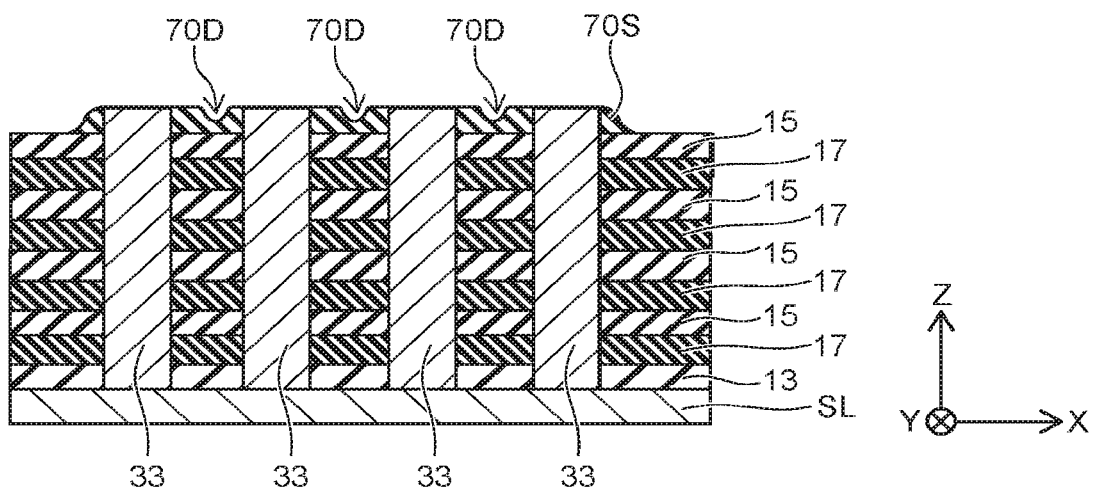

As shown in FIG. 24B, the stopper film 70 is etched back so that a portion thereof remains at the region where the multiple sacrificial films 33 are provided. For example, the stopper film 70 is etched back using RIE. Thereby, the stopper film 70S is formed around the upper ends of the sacrificial films 33. The stopper film 70S is formed to cover the region where the sacrificial films 33 are formed so that the upper surfaces of the sacrificial films 33 are exposed at the surface of the stopper film 70S. Also, the stopper film 70S includes the recess 70D positioned between the adjacent sacrificial films 33.

Figure 24C:
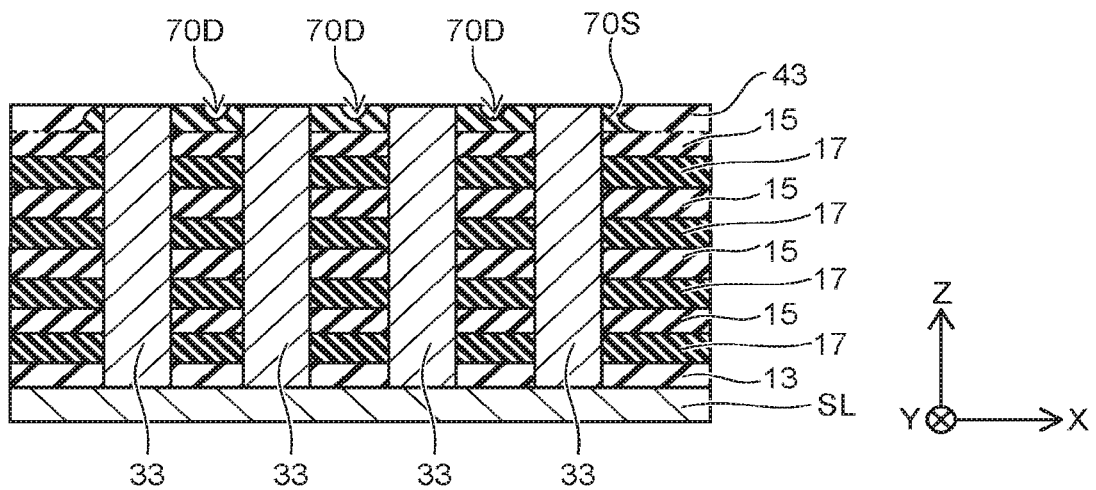

As shown in FIG. 24C, the insulating film 43 is formed on the inter-layer insulating film 15T. The insulating film 43 is formed so that the upper surfaces of the sacrificial films 33 and the upper surface of the stopper film 70S are exposed. For example, the insulating film 43 is partially removed using CMP or subjected to etch-back after being formed to cover the sacrificial films 33 and the stopper film 70S by using CVD. The surface of the insulating film 43 is planarized in which the upper surfaces of the sacrificial films 33 and the upper surface of the stopper film 60S are exposed.

FIG. 25 is a schematic plan view showing the surface of the insulating film 43. As shown in the drawing, the insulating film 43 is formed to surround the region where the sacrificial films 33 are provided. Moreover, the insulating film 43 includes a portion formed inside the recess 70D positioned between the adjacent sacrificial films 33.

As shown in FIG. 25, for example, the stopper film 70S is not formed in the region where the slit ST is provided. Also, the stopper film 70S is not formed at both sides in the Y-direction of the region where the multiple sacrificial films 33 are provided. For example, the contact plugs that are connected to the word lines WL1 are provided in this region.

Figure 26A:
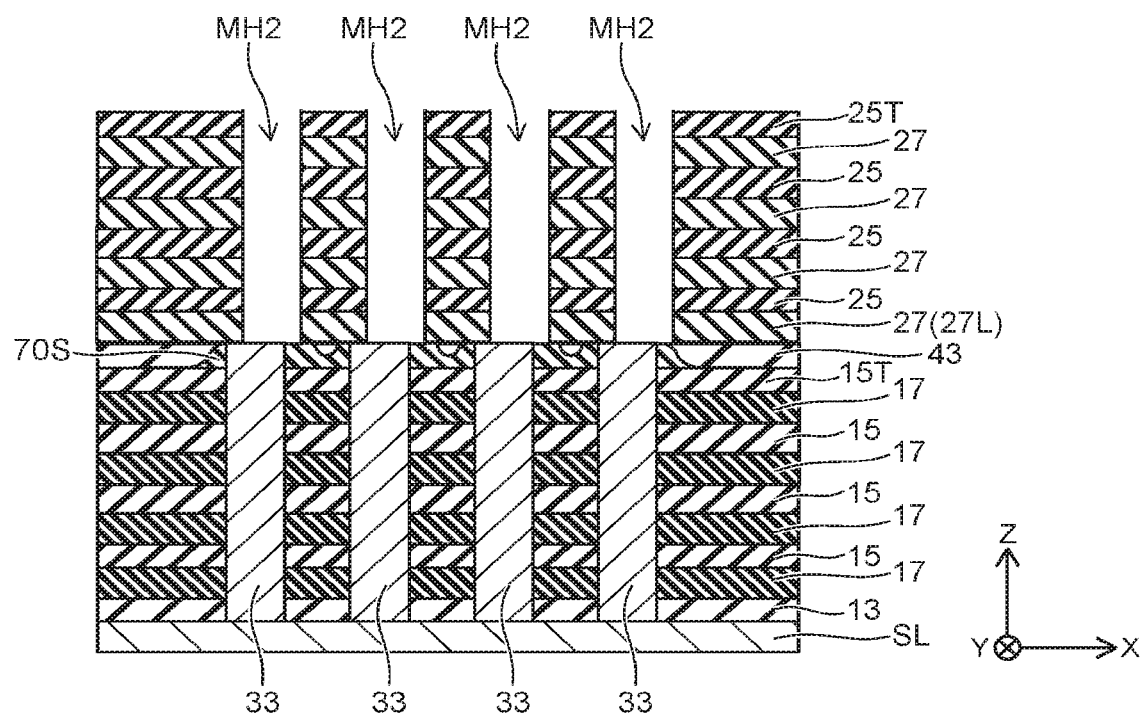

As shown in FIG. 26A, the multiple sacrificial films 27 are stacked on the sacrificial film 33, the stopper film 70S and the insulating film 43 with the inter-layer insulating films 25 interposed. The inter-layer insulating film 25 and the sacrificial film 27 are alternately stacked. Subsequently, the memory hole MH2 is formed from the surface of the inter-layer insulating film 25T at the top position so that the memory hole MH2 communicates with the sacrificial film 33. Although, in the example, the inter-layer insulating film 25 is formed between the stopper film 70S and a sacrificial film 27L at the bottom position, the sacrificial film 27L may be provided in the structure in which the sacrificial film 27L contacts the stopper film 70S.

The stopper film 70S protects the inter-layer insulating film 15T and the sacrificial films 17 provided below the stopper film 70S in the process of forming the memory hole MH2. Thereby, the inter-layer insulating film 15T and the sacrificial films 17 can be prevented from being etched when the bottom surface of the memory hole MH2 is shifted from a position matching the upper surface of the sacrificial film 33 due to the misalignment of the memory hole MH2 (referring to FIG. 15B).

Figure 26B:
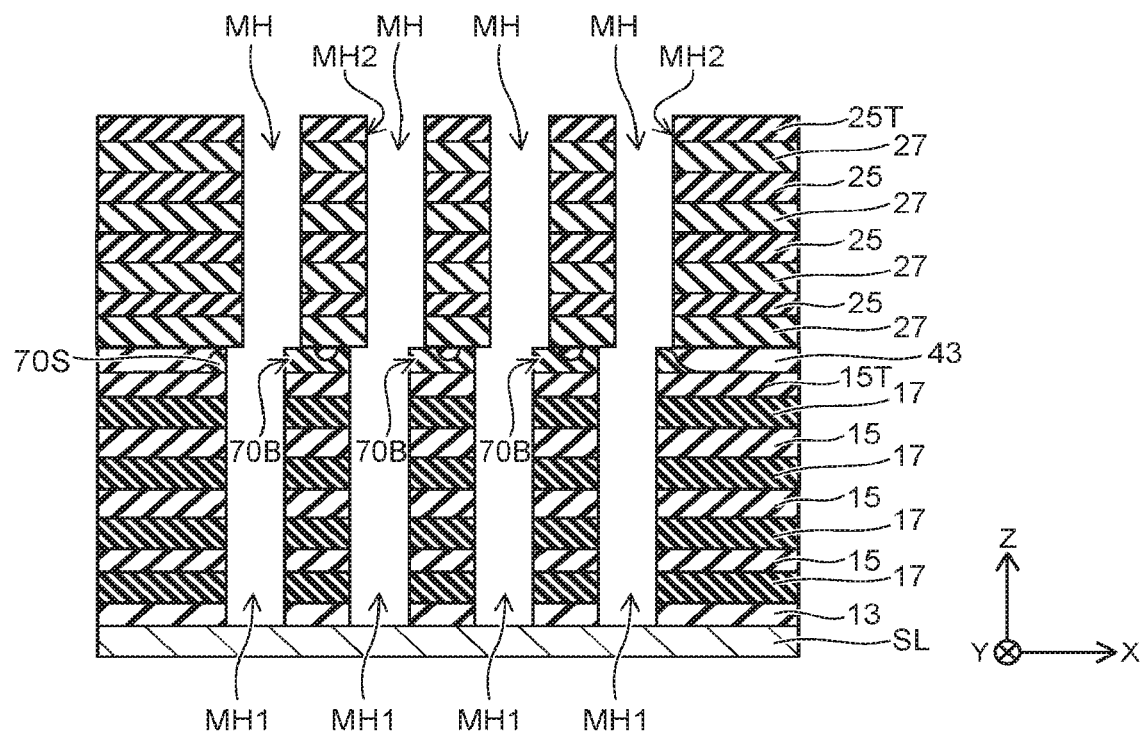

As shown in FIG. 26B, the memory hole MH is formed with a depth reaching the source layer SL from the upper surface of the inter-layer insulating film 25T. The memory hole MH is formed by, for example, selectively removing the sacrificial film 33.

Continuing, the memory film MF, the semiconductor film SF, and the insulating core CA are formed inside the memory hole MH. Also, the word lines WL1 and WL2 and the select gates SGS and SGD are formed by selectively removing the sacrificial films 17 and 25 and replacing the sacrificial films 17 and 25 with metal layers.

Figure 27:
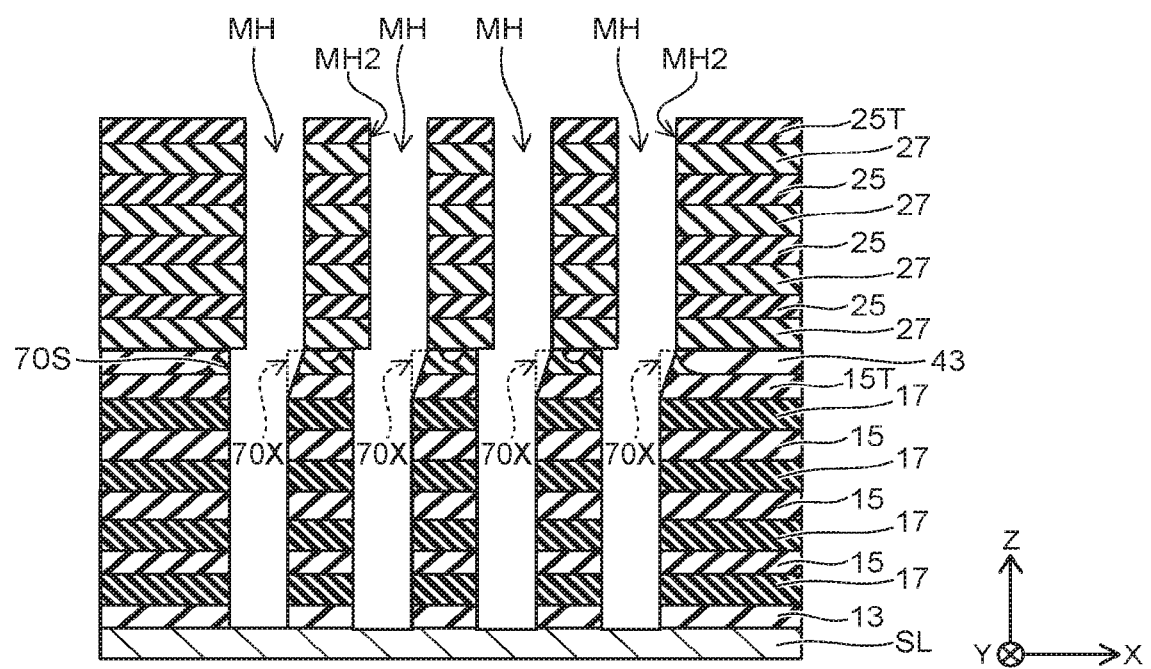
FIG. 27 is a schematic cross-sectional view showing a manufacturing process of the memory device according to the modification of the fourth embodiment.

FIG. 27 is a schematic cross-sectional view showing a manufacturing process of the memory device 7 according to the modification of the fourth embodiment. In the example, after forming the memory hole MH shown in FIG. 26B, a portion 70X is removed in the stopper film 70S.

For example, after forming the memory hole MH2, the stopper film 70S is partially exposed at the bottom surface of the memory hole MH2 (referring to FIG. 26A). Therefore, the portion 70X of the stopper film 70 protruding from the inner wall of the memory hole MH remains after the sacrificial film 33 is selectively removed. For example, the portion 70X of the stopper film 70 is removed using anisotropic RIE.

In the example, it is possible to form the memory film MF and the semiconductor film SF on the inner surface of the memory hole MH with a uniform thickness over the region where the portion 70X of the stopper film 70 is removed. Moreover, by reducing the length in the vertical direction of the semiconductor film SF in the connection region between the columnar body PB2 and the columnar body PB1, the channel current flowing in the Z-direction can be prevented from decreasing.

Figure 28:
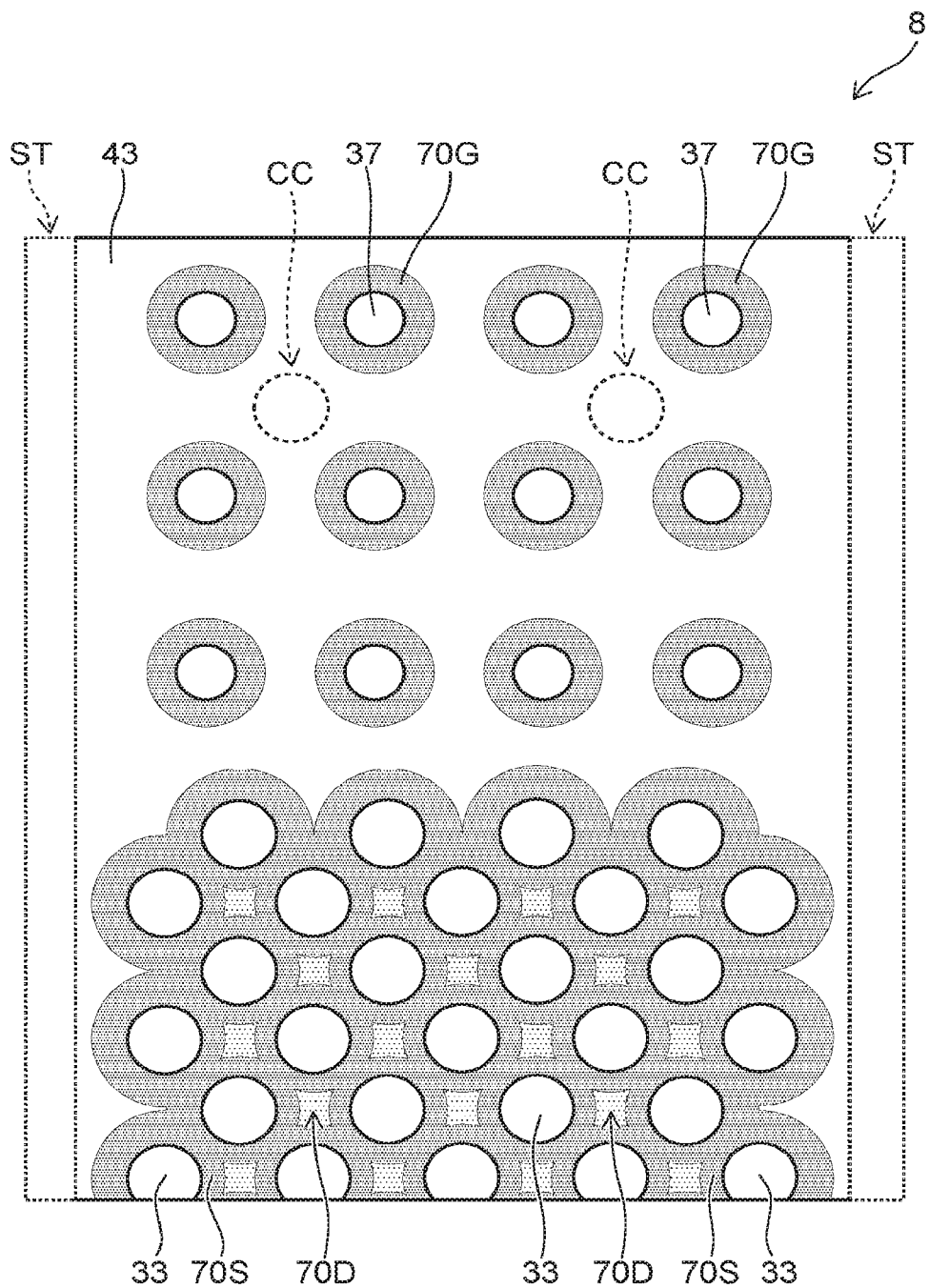
FIG. 28 is a schematic plan view showing a memory device according to another modification of the fourth embodiment.

FIG. 28 is a schematic plan view showing a memory device 8 according to another modification of the fourth embodiment. FIG. 28 is a plan view corresponding to FIG. 25 and illustrates the surface of the insulating film 43.

As shown in FIG. 28, the sacrificial films 33 and sacrificial films 37 are provided in the manufacturing processes of the memory device 8. The sacrificial films 33 and 37 extend in the Z-direction and extend through the sacrificial films 17 stacked on the source layer SL with the inter-layer insulating films 13 and 15 interposed. For example, the sacrificial films 33 are formed in the region where the columnar bodies PB are provided. The sacrificial films 37 are provided, for example, in the region where contact plugs CC are provided. For example, the sacrificial films 37 are replaced with columnar support bodies (not illustrated). For example, the columnar support bodies support the interlayer insulating films 15 in the process of forming the word lines WL1 and the select gate SGD by replacing the sacrificial films 17 with the metal layers. The columnar support bodies are provided to maintain the space that remains after the sacrificial films 17 are selectively removed.

In the example, stopper films 70G surrounding the sacrificial films 37 are provided in addition to the stopper film 70S. For example, the stopper films 70G are provided to surround the columnar support bodies (not illustrated) between the word line WLT1 and the word line WLL2. The stopper films 70G are provided around the multiple columnar support bodies and are separated from each other.

The examples described in the first to fourth embodiments are not limited to the aspects described in the examples. For example, structural elements having the same reference numerals are common between the embodiments, and a structural element described in one embodiment is applicable also to the other embodiments if technically possible.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor memory device, comprising:
   a plurality of first electrode layers stacked in a first direction;
   a plurality of second electrode layers stacked in the first direction;
   a first columnar body extending through the plurality of first electrode layers in the first direction;
   a second columnar body extending through the plurality of second electrode layers in the first direction;
   a connection part connecting the first columnar body and the second columnar body; and
   a first film surrounding the connection part, the first film having an annular shape,
   the plurality of first electrode layers and the plurality of second electrode layers being arranged in the first direction,
   the connection part and the first film being provided between the plurality of first electrode layers and the plurality of second electrode layers,
   the connection part being surrounded with the first film, the connection part having a minimum width in a second direction orthogonal to the first direction,
   the plurality of second electrode layers including a second electrode provided at a position most proximate to the connection part,
   the second columnar body having a second width in the second direction at a portion extending through the second electrode layer of the plurality of second electrode layers, the second width of the second columnar body being less than the minimum width of the connection part.

2. The semiconductor memory device according to claim 1, wherein
   the first columnar body includes a portion extending through the plurality of first electrode layers, the minimum width of the connection part being less than a width in the second direction at the portion of the first columnar body.

3. The semiconductor memory device according to claim 1, wherein
   the first film has a width in a second direction orthogonal to the first direction, the width of the first film being greater than a width in the second direction of the first columnar body.

4. The semiconductor memory device according to claim 1, wherein
   the first columnar body has a substantially circular configuration in a cross-section orthogonal to the first direction; and
   the first columnar body has a center in the cross-section orthogonal to the first direction, the center of the first columnar body being substantially aligned with a center of the first film in a cross section orthogonal to the first direction.

5. The semiconductor memory device according to claim 2, wherein
   the plurality of first electrode layers includes a first electrode provided at the furthest position from the connection part; and
   the first columnar body has a first width in the second direction at a portion extending through the first electrode layer of the plurality of first electrode layers, the first width of the first columnar body being greater than the minimum width of the connection part.

6. The semiconductor memory device according to claim 2, wherein the second columnar body has a width in the second direction less than a width in the second direction of the first columnar body.

7. The semiconductor memory device according to claim 1, wherein
   the first columnar body and the connection part include an insulating core and a semiconductor film, the insulating core extending in the first direction, the semiconductor film surrounding the insulating core and extending in the first direction; and
   the semiconductor film has an outer diameter at the first columnar body and another outer diameter at the connection part, the outer diameter at the first columnar body being greater than a minimum value of said another outer diameter at the connection part.

8. A semiconductor memory device, comprising:
   a plurality of first electrode layers stacked in a first direction;
   a plurality of second electrode layers stacked in the first direction;
   a first columnar body extending through the plurality of first electrode layers in the first direction;
   a second columnar body extending through the plurality of second electrode layers in the first direction, the second columnar body being connected to the first columnar body; and
   a second film surrounding an end portion of the first columnar body connected to the second columnar body, the second film having an annular shape,
   the plurality of first electrode layers and the plurality of second electrode layers being arranged in the first direction,
   the second film being positioned between the plurality of first electrode layers and the plurality of second electrode layers, the second film including a first portion and a second portion, the second portion being provided between the first columnar body and the first portion, a first width in the first direction of the first portion being less than a second width in the first direction of the second portion, the plurality of second electrode layers including a second electrode layer provided at a position most proximate to the second film, the first columnar body having a first width in a second direction orthogonal to the first direction at the end portion surrounded by the second film, the second columnar body having a second width in the second direction at a portion extending through the second electrode layer, the second width of the second columnar body being less than the first width of the first columnar body.

9. The semiconductor memory device according to claim 8, wherein the plurality of first electrode layers includes a first electrode layer provided at a position most proximate to the second film;

the second film includes a first surface facing the first electrode layer, the second film having a first length of the first surface in the second direction along the first surface, the second direction being directed from the first columnar body toward an outer edge of the second film; and the second film includes a portion provided between the first surface and the second electrode layer, the portion of the second film having a second length in the second direction, the first length being greater than the second length.

10. The semiconductor memory device according to claim 8, further comprising:

a first insulating film provided between two mutually-adjacent first electrode layers of the plurality of first electrode layers; and a second insulating film provided between two mutually-adjacent second electrode layers of the plurality of second electrode layers, the second film including a material different from a material of the first insulating film and a material of the second insulating film.

11. The semiconductor memory device according to claim 10, wherein the second film includes a metal oxide.

12. The semiconductor memory device according to claim 10, wherein the second film includes a semiconductor.

13. The semiconductor memory device according to claim 12, further comprising:

a third insulating film provided between the plurality of first electrode layer and the plurality of second electrode layer.

* * * * *